United States Patent [19]
Ooishi

[11] Patent Number: 5,355,348
[45] Date of Patent: Oct. 11, 1994

[54] SEMICONDUCTOR MEMORY DEVICE AND MEMORY ACCESS SYSTEM USING A FOUR-STATE ADDRESS SIGNAL

[75] Inventor: Tsukasa Ooishi, Hyogo, Japan

[73] Assignee: Mitsubishi Denki Kabushiki Kaisha, Tokyo, Japan

[21] Appl. No.: 834,041

[22] Filed: Feb. 11, 1992

[30] Foreign Application Priority Data

Feb. 12, 1991 [JP] Japan ................. 3-018961

[51] Int. Cl.$^5$ .................................................. G11C 7/00
[52] U.S. Cl. .......................... 365/230.06; 365/230.01; 365/230.02
[58] Field of Search ............. 365/230.01, 230.06, 365/230.02, 189.01

[56] References Cited

U.S. PATENT DOCUMENTS

| | | | |
|---|---|---|---|
| 3,972,031 | 7/1976 | Riemenschneider | 365/78 |
| 4,581,722 | 4/1986 | Takemae | 365/230.06 |
| 4,636,990 | 1/1987 | Buscaglia et al. | 365/230.01 |
| 4,845,678 | 7/1989 | van Berkel | 365/230.09 |
| 4,929,945 | 5/1990 | Kushiyama | 341/50 |
| 5,105,386 | 4/1992 | Andoh et al. | 365/230.06 |
| 5,161,218 | 11/1992 | Catlin | 365/230.06 |

FOREIGN PATENT DOCUMENTS

| | | | |
|---|---|---|---|
| 0277696 | 12/1987 | Japan | 365/230.06 |
| 03272092 | 12/1991 | Japan | 365/230.06 |
| 0444691 | 2/1992 | Japan | . |

OTHER PUBLICATIONS

IBM Technical Disclosure Bulletin vol. 29 No. 9 Feb. 1987.

Primary Examiner—Eugene R. LaRoche
Assistant Examiner—Tan Nguyen
Attorney, Agent, or Firm—Lowe, Price, LeBlanc & Becker

[57] ABSTRACT

The disclosed is an DRAM which is accessible in response to four-state address signal. A two-state address signal generator receives the four-state address signal respectively defined by four voltage levels and converts it to a row address signal and a column address signal which are two-state address signals. Converted address signals are supplied to a row decoder and a column decoder, respectively. Address signals for access are supplied without adopting an address multiplexing system, so that it is possible to perform accurate addressing under the requirement of high speed operation. In addition, the number of sense amplifiers to be activated in one read operation can be reduced, and therefore power consumption can be also reduced.

21 Claims, 25 Drawing Sheets

SEMICONDUCTOR MEMORY DEVICE AND MEMORY ACCESS SYSTEM USING A FOUR-STATE ADDRESS SIGNAL

BACKGROUND OF THE INVENTION

1. Field of the Invention

This invention relates generally to semiconductor memory devices and memory access systems, and more particularly, to a semiconductor memory device and a memory access system using an address signal having four states for high speed operation. The invention has particular applicability to dynamic random access memories (DRAMs).

2. Description of the Background Art

Recently, semiconductor memories have been widely used in various electronic apparatus. In particular, a dynamic random access memory (hereinafter referred to as a "DRAM") has a larger storage capacity compared to other semiconductor memories, for example a static random access memory (hereinafter referred to as an "SRAM"), and therefore it is frequently employed for data storage in a computer system. That is, a DRAM is used to constitute for example a main memory in a computer system because of its low cost per bit in data storage and high degree of integration.

With the advancement of recent VLSI design and process technology, an operation speed of a microprocessor has become higher, and higher speed memory access has become necessary in a computer system. That is, a semiconductor memory used in a computer system, for example, a DRAM, a SRAM, etc. needs to operate at a higher speed. Under this situation, the operation speed of a DRAM and a SRAM has become higher in recent years, and it is predicted that the operation speed will reach almost the limit in the near future. The invention is applicable generally to semiconductor memories for higher speed memory access, but application to a DRAM will be described by way of an example.

FIG. 14 is a block diagram of a memory access circuit showing a background of the invention in a computer system. Referring to FIG. 14, this memory access circuit comprises a microprocessing unit (hereinafter referred to as an "MPU") 1 and a DRAM 110 accessed by MPU 1. The following circuit is provided for the interface between MPU 1 and DRAM 110. In the following description, it is assumed that DRAM 110 has a memory capacity of 16M bits.

An address expansion circuit 2 performs a process for expanding address space in order to handle memory space exceeding address space which allows direct addressing by MPU 1. A real address converter 3 receives a virtual address signal VA generated from MPU 1 and generates row address signals RA0 through RA11 and column address signals CA0 through CA11 for access to DRAM 110 by real address conversion. An address multiplexer 105 receives row address signals RA0 through RA11 and column address signals CA0 through CA11, and performs switching operation for address multiplexing. That is, address multiplexer 105 outputs row address signals RA0 through RA11 and column address signals CA0 through CA11 alternately, that is, in a time division multiplexing manner, in response to a switching control signal /MPX generated from a timing controller 106. Consequently, a row address signals and a column address signals which have 24 bits in total can be obtained as 12 bit address signals A0–A11 by performing a time division multiplexing process. Address signals A0 through A11 are applied to DRAM 110 through an address buffer 107. MPU 1 can access not only DRAM 110 but also other memory devices and input/output devices, etc. (not shown).

In the memory access circuit shown in FIG. 14, only control signals to access DRAM 110 are indicated. When MPU 1 requires a read operation to DRAM 110, MPU 1 applies a memory read signal /MR to timing controller 106. When MPU 1 requires a write operation to DRAM 110, MPU 1 applies a memory write signal /MW to timing controller 106. In addition, MPU 1 applies state signals /S0 and /S1 to timing controller 106 to show a status of an operation cycle in MPU. Timing controller 106 applies a wait signal /WAIT to MPU 1 in a period of memory access to DRAM 110. Timing controller 106 generates a row address strobe signal /RAS, a column address strobe signal /CAS and a write enable signal /WE and a switching control signal /MPX. Signals /RAS, /CAS and /WE are applied to DRAM 110 through a control signal driver 8. A data buffer 9 is connected between MPU 1 and DRAM 110, and data buffer 9 transfers data D to/from DRAM 110 in response to a write control signal /WR generated from timing controller 106.

FIG. 15 is a time chart of a read cycle in the memory access circuit shown in FIG. 14. In the following description, it is assumed that a read cycle and a write cycle are performed in 4 period of a reference clock signal CLK. Referring to FIG. 15, a memory access request signal /CS and state signals /S0 and /S1 generated by decoding memory address signals are sampled in response to the fall of a clock signal CLK. A signal /RAS and a signal /MPX fall in response to the first fall of a clock signal CLK. Address multiplexer 105 first outputs row address signals RA0 through RA11, and in response to the fall of a signal /MPX it is switched and outputs column address signals CA0 through CA11. In a timing chart of FIG. 15 only i-th bit is indicated among address signals A0 through A11 of 12 bits in total. Therefore, in response to a signal /MPX, i-th row address signal RAi is switched to i-th column address signal CAi. Thus, address signals A0 through A11 of 12 bits each processed in a time division multiplexing manner are generated from address multiplexer 105. A signal /CAS falls in response to the second rise of clock signal CLK (period T2). Address signals A0 through A11 processed in a time division multiplexing manner are applied to DRAM 110 through address buffer 107 and then a read operation from DRAM 110 is performed.

FIG. 16 is a time chart of a write cycle in the memory access circuit shown in FIG. 14. The write cycle is also performed in four periods of clock signal CLK. Referring to FIG. 16, in response to the first rise of clock signal CLK, signals /RAS and /MPX rise. Therefore, in response to signal /MPX, address multiplexer 105 outputs column address signals CA0 through CA11 in stead of row address signals RA0 through RA11. Address signals processed in a time division multiplexing manner are applied to DRAM 110 through address buffer 107 as address signals A0 through A11 of 12 bits, and then a read operation from DRAM 110 is performed.

As an operation speed of microprocessor, that is, MPU has recently been increased, there is an increasing requirement for a DRAM having a higher operation speed. An operation speed of a DRAM has been increased as the generation of a DRAM advances. In a DRAM having memory capacity of 4 megabits or 16 megabits, 60 ns or 120 ns cycle time has already been achieved. It is predicted that this trend is going to continue in future and that the access time will be more shortened. In addition, it is also predicted that the time length allowed for access control between a MPU and a DRAM will be shorter and access control timing will be more complicated.

FIG. 17 is a block diagram of the conventional DRAM 110 shown in FIG. 14. Referring to FIG. 17, the DRAM 110 comprises a memory cell array 11 including a number of memory cells arranged in columns and rows, a row decoder 12 for selecting a memory cell row, a column decoder 13 for selecting a memory cell column, a sense amplifier 14 for amplifying a data signal read from a memory cell. One address buffer 115 receives address signals A0 through A11 processed in a time division multiplexing manner by the aforementioned address multiplexer 105. A clock signal generator 118 generates various clock signals necessary for the operation of DRAM 110 in response to signals /RAS, /CAS and /WE. A data input buffer 16 receives a data signal Din to be written and applies it to memory cell array 11 through an IO bus. A data output buffer 17 receives and outputs a read data signal Dout through an IO bus.

Address signals A0 through A11 applied to address buffer 115 include row address signals RA0 through RA11 and column address signals CA0 through CA11 processed in a time division multiplexing manner as mentioned above, and row address signals RA0 through RA11 are applied to row decoder 12 and column address signals CA0 through CA11 are applied to column decoder 13 by clock signals generated from clock signal generator 118.

FIG. 18 is a time chart for describing a read operation of a DRAM shown in FIG. 17. Referring to FIG. 18, a read operation is defined by a fall of a signal /CAS after at least time period $t_{RCS}$ has passed from a rise of a signal /WE. An address signal Ai processed in a time multiplexing manner is latched within address buffer 115 in response to the fall of a signal /RAS and a row address signal RAi is obtained. In addition, address signal Ai is latched within address buffer 115 in response to the fall of a signal /CAS and a column address signal CAi is obtained. Row address signal RAi and column address signal CAi latched within address buffer 115 are applied to row decoder 12 and column decoder 13, respectively. Row decoder 12 activates one word line (not shown) in response to row address signals RA0 through RA11. Sense amplifier 14 amplifies a data signal read from a memory cell connected to the activated word line. Column decoder 13 selects one bit line pair in response to column address signals CA0 through CA11, and the amplified data signal Dout is output through data output buffer 17. In FIG. 18, /RAS access time $t_{RAC}$, /CAS access time $t_{CAC}$ and address access time $t_{AA}$ are indicated. An output terminal Dout is normally brought into high impedance state (Hi-Z), but it is activated only when the read data signal is output. In FIG. 18, /RAS active time $t_{RAS}$ and /RAS precharge time $t_{RP}$ are also indicated.

FIG. 19 is a time chart for describing the write operation of the DRAM shown in FIG. 17. The time chart shows an early write operation. That is, a write operation is started by the fall of a signal /WE prior to the fall of a signal /CAS. Similarly to the read operation shown in FIG. 18, a row address signal RAi and a column address signal CAi processed in a time multiplexing manner are latched within address buffer 115, and a data signal Din applied through a data input buffer 16 is written to the memory cell designated by these address signals.

FIG. 20 is a circuit diagram of memory cell array 11 and peripheral circuit thereof shown in FIG. 17. Referring to FIG. 20, a memory cell M comprises an NMOS transistor Qs for switching and capacitor Cs for storing a data signal. The memory cell M is connected to a j-th bit line BLj. Transistor Qs has its gate connected to a k-th word line WLk. Sense amplifier 14 comprises NMOS transistors Q1 and Q2, and PMOS transistors Q3 and Q4. The sense amplifier 14 is activated in response to sense amplifier activation signals $\phi_N$ and $\phi_P$.

FIG. 21 is a time chart for describing the operation of the circuit shown in FIG. 20. Referring to FIGS. 20 and 21, a read operation will be described below. The potential of word line WLk is raised by a row decoder, so that transistor Qs is turned on. Therefore, a very small potential difference appears between bit line pair BLj and /BLj. Sense amplifier 14 is activated in response to an activation of sense amplifier activation signals Sn and Sp, so that a very small potential difference is amplified. This amplification is performed by charging and discharging a bit line pair BLj and /BLj by sense amplifier 14. Subsequently, column decoder 13 raises a signal Yj, so that gate transistors Q8 and Q9 are turned on and an amplified signal is applied to an IO bus line pair. A data signal on the IO bus line pair is output through data output buffer 17.

FIG. 22 is a block diagram of address buffer 115 shown in FIG. 17. In this figure only the circuit which handles an i-th bit Ai among address signals A0 through A11 of 12 bits. Referring to FIG. 22, the address buffer 115 comprises a row address input circuit 601 for receiving a row address signal, a switching circuit 602 for interlock, a row address latch circuit 603, a column address input circuit 604 for receiving a column address signal, a switching circuit 605 for interlock, and a column address latch circuit 606.

FIG. 23 is a timing chart for describing the operation of address buffer 115 shown in FIG. 22. Referring to FIGS. 22 and 23, the operation will be described. Control signals /RASA, /RAI, /RAL, /CASA, /CAI and /CAL are generated from clock signal generator 18 shown in FIG. 17.

A signal /RASA falls at time t1, so that a row address signal RAi which is the first half of an applied address signal Ai is received by a row address input circuit 601. Subsequently, at time t2, signal /RAI falls, so that the received signal is applied to a row address latch circuit 603 through a switching circuit 602. At time t3 a signal /RAL falls, so that row address latch circuit 603 latches applied row address signal RAi. At time t4, a column address signal CAi which is the latter half of an address signal Ai is applied. At time t5 a signal /CASA falls, so that a column address signal CAi is received by a column address input circuit 604. At time t6 a signal /CAI falls, so that the received column address signal CAi is applied to a column address latch circuit 606 through a switching circuit 605. At time t7, a signal /CAI falls, so that column address latch circuit 606 latches column address signal CAi. Row address signal RAi and column address signal CAi latched within latch circuit 603 and 606 respectively are transferred to row decoder 12 and column decoder 13, respectively.

As can be seen from FIG. 23, in the period from time t3 when signal /RAL falls to time t4, row address signal RAi must be latched within a row address latch circuit 603. However, the time length of this period Δt becomes shorter and shorter, as an operation speed of the DRAM increases. As the time length Δt becomes shorter, row address signal RAi needs to be certainly latched in this short time length Δt. Otherwise, a correct address signal is not supplied to row decoder 12 and therefore incorrect access is caused.

Such a problem is considered to result from adopting an address multiplexing system in a DRAM. That is to say, timing control in the switch is difficult because row address signals and column address signals are supplied in a time division multiplexing manner through one address terminal. A pseudo-SRAM has been developed conventionally in order to avoid such a problem. A pseudo-SRAM has a large capacity of a DRAM and usability of a SRAM. The aforementioned problem in latch timing of address signals processed in a time division multiplexing manner can be avoided, since the aforementioned address multiplexing system is not adopted. However, address input pins for receiving a row address signal and a column address signal respectively are needed, so that twice as many address input pins as those in a DRAM having the same memory capacity are required. This implies that it is necessary to enlarge the package of the pseudo-SRAM, and therefore a decline in packaging efficiency on a printed board cannot be avoided.

In addition to the above problem, the following problem is also pointed out concerning power consumption of a DRAM. FIG. 24(A) is a schematic diagram showing a memory cell size of a memory cell array 11 shown in FIG. 17. DRAM 110 shown in FIG. 17 is accessed in response to row address signals RA0 through RA11 and column address signals CA0 through CA11 each having 12 bits. Since the numbers of bits of a row address and a column address are the same, the same number of memory cells, that is, 4090 ($=2^{12}$) memory cells are provided in each of a row direction and a column direction. That is to say, as shown in FIG. 24(A), $2^{12}$ memory cells MC are placed along one word line WL and $2^{12}$ memory cells MC are placed along one bit line BL. In other words, memory cell array 11 has a shape of almost square.

FIG. 25 is a waveform diagram showing the change of a power consumption level of a conventional DRAM. Referring to FIG. 25, consumption current Irow indicates the maximum current consumed by a row address system circuit and current Iary indicates the maximum current consumed in one read operation in memory cell array 11. Current Icul indicates the maximum current consumed by a column address system circuit and current Ires indicates the maximum current consumed for reset. As can be seem from FIG. 25, current Iray consumed by a memory cell array and its peripheral circuit in one read operation is larger than any other consumption current, and therefore, when this consumption current Iary is supplied from a power supply potential Vcc, a power supply level falls by ΔV because of a voltage drop. This voltage drop can be a cause of malfunction which may occur in this DRAM.

FIG. 26(A) is a graph showing consumption current in a conventional DRAM. Referring to FIG. 26(A) power Pary consumed by a memory cell array and its peripheral circuit occupies more than a half of all the power consumption and the rest is occupied by power consumption Pcul of column system circuit and power consumption Prow by a row system circuit. The reason why the current consumed by the memory cell array and its peripheral circuit is large is described below.

As shown in FIG. 20, a sense amplifier 14 is connected to each of bit lines of memory cell array 11. As described above, sense amplifier 14 consumes large current to charge and discharge bit lines BLj and /BLj. Therefore, power consumption of sense amplifier 14 occupies the large part of power consumption Pary shown in FIG. 26(A).

Referring again to FIG. 24(A), since $2^{12}$ memory cells MC are connected to word line WL along word line WL, $2^{12}$ sense amplifiers SA1 are connected to as many bit lines BL. $2^{12}$ sense amplifiers SA1 are activated in one read operation and each sense amplifier charge/discharge bit line BL, and therefore large power is consumed.

SUMMARY OF THE INVENTION

One object of the invention is to perform accurate addressing in a high speed operation in a semiconductor memory device.

Another object of the invention is to perform accurate addressing in a high speed operation without increasing the number of address input pins in the semiconductor memory device.

Yet another object of the invention is to reduce a maximum current consumed in one read operation in the semiconductor memory device.

Still another object is to perform accurate addressing in a semiconductor memory device for high speed memory access in a memory access system.

A semiconductor memory device according to the invention comprises a memory cell array including a first plurality of memory cells arranged in rows and columns, an address input pin receiving a four-state address signal having four states for designating a row and a column of the memory cell array, a two-state address generating circuit generating a two-state row address signal and a two-state column address signal each having two states in response to the four-state address signal, a selecting circuit selecting a row and a column of the memory cell array in response to the two-state row address signal and the two-state column address signal.

In operation, the two-state address generating circuit generates a two-state row address signal and a two-state column address signal in response to an applied four-state address signal. In other words, an applied four-state address signal is converted to a two-state row address signal and a two-state column address signal. One four-state address signal comprises one bit of the two-state row address signal and one bit of the two-state column address signal. That is, one four-state address signal can transmit an address signal of two bits, so that it is not necessary to adopt an address multiplexing system for designating a row and a column of the memory cell array. Therefore, even if a high speed operation is required, the generation of incorrect accessing which might be caused by switching for an address multiplexing system can be prevented.

According to another aspect of the invention, a memory access system comprises a semiconductor memory device including a plurality of memory cells arranged in a row and a column, a two-state address generating circuit generating a two-state row address signal and a two-state column address signal each having two states, and an address converting circuit generating a four-state address signal having four states for designating a row and a column of the memory cell array. A semiconductor memory device comprises an address reverse conversion circuit reversely converting a four-state address signal to a two-state row address signal and a two-state column address signal, a selecting circuit selecting a row and a column of the memory cell array in response to the converted two-state row address signal and the two-state column address signal.

In operation, the address converting circuit converts a four-state address signal to a two-state row address signal and a two-state column address signal. Therefore, a four-state address signal for designating a row and a column of the memory cell array are supplied to the semiconductor memory device, so that even if a high speed memory access is required, it is possible to supply an accurate address signal to the semiconductor memory device.

According to yet another aspect of the invention, a semiconductor memory device comprises a first plurality of memory cells arranged in a second plurality of rows and a third plurality of columns.

The second plurality is larger than the third plurality according to an exponential function of 2. This semiconductor memory device further comprises the third plurality of sense amplifiers provided in a row direction of a memory cell array and amplifying a data signal read from a memory cell, address input pins receiving a four-state address signal having four states for designating a row and a column of the memory cell array, a two-state address generating circuit generating two-state address signals each having two states in response to the four-state address signal, an address distributing circuit distributing the two-state address signals generated from the two-state address generating circuit to a two-state row address signal for selecting a row of the memory cell array and a two-state column address signal for selecting a column of the memory cell array, a selecting circuit selecting a row and a column of the memory cell array in response to the two-state row address signal and the two-state column address signal.

The foregoing and other objects, features, aspects and advantages of the present invention will become more apparent from the following detailed description of the present invention when taken in conjunction with the accompanying drawings. dr

DESCRIPTION OF THE PREFERRED EMBODIMENTS

Figure 1:
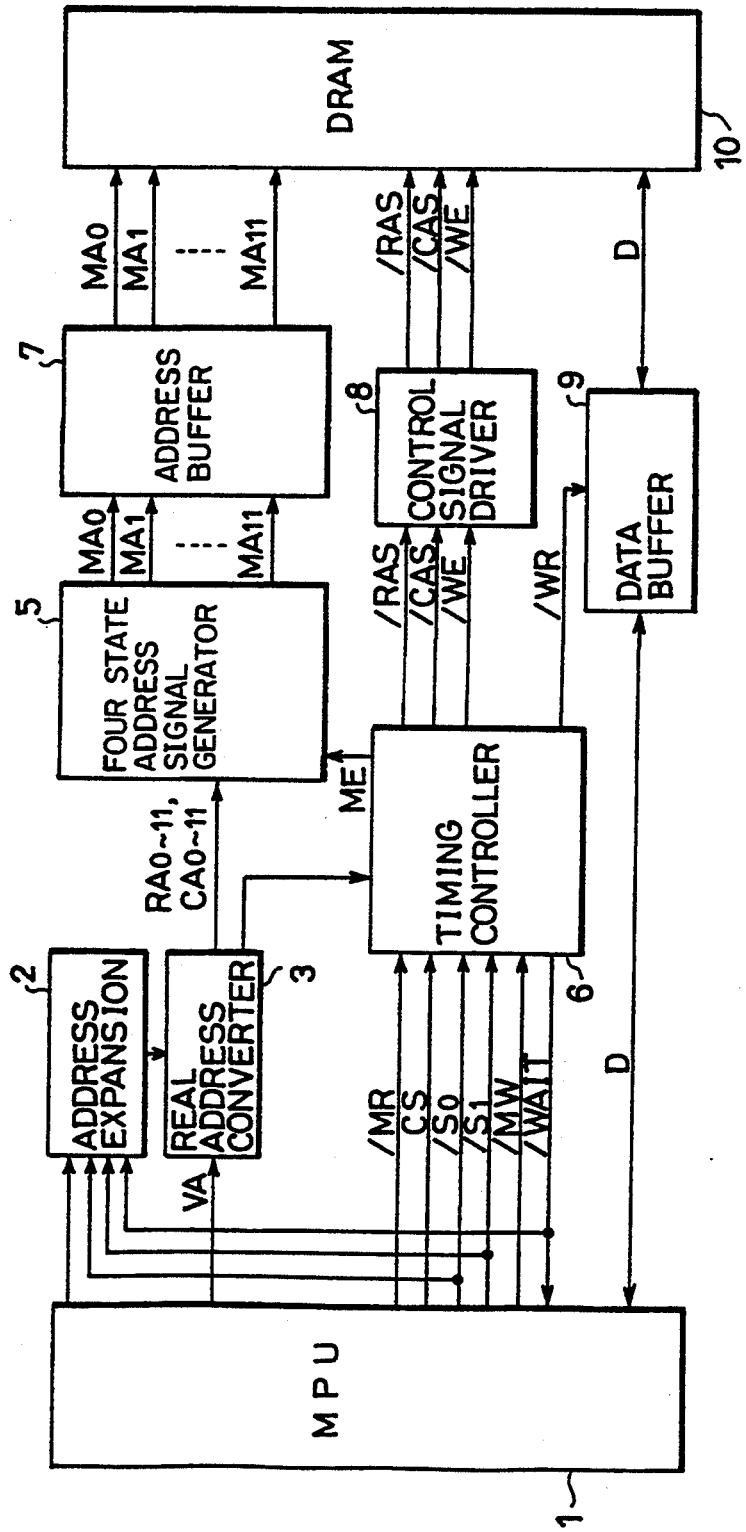
FIG. 1 is a block diagram of a memory access circuit showing one example of the invention.
Figure 14:
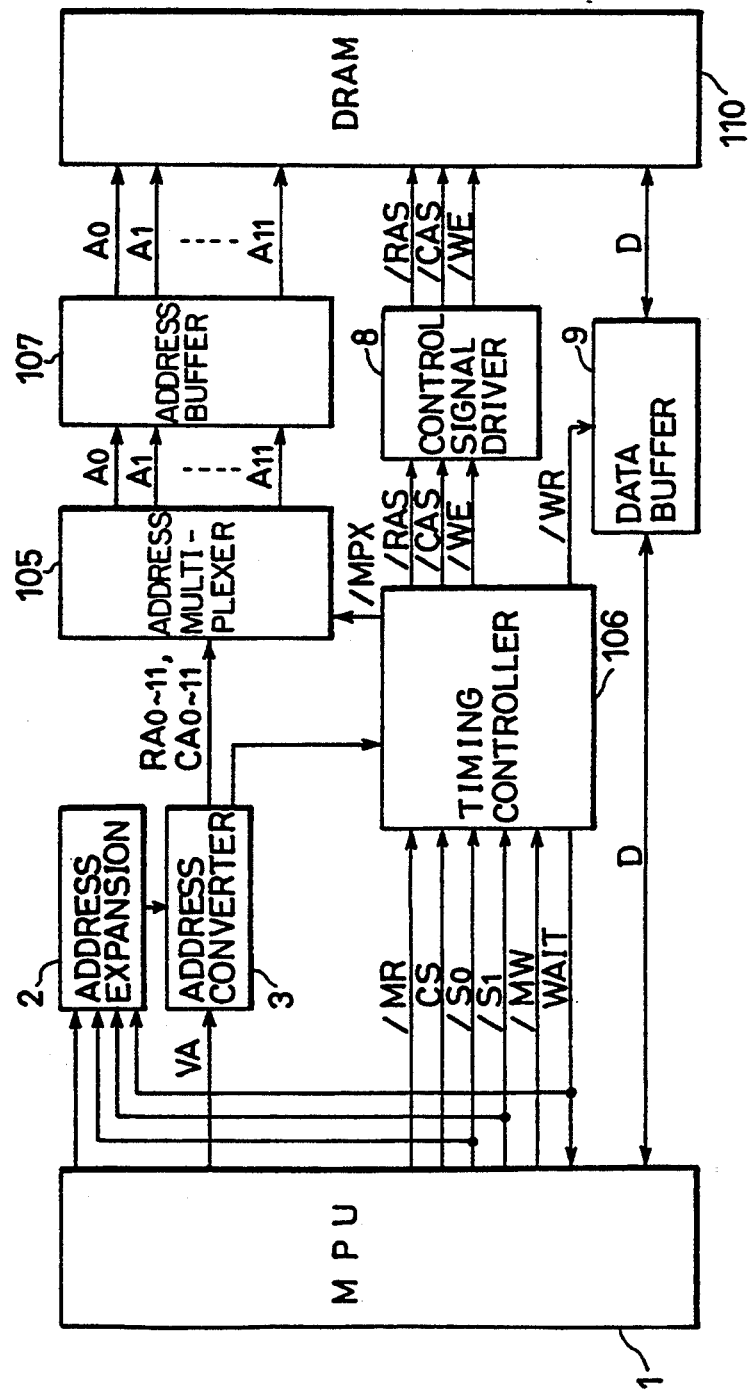
FIG. 14 is a block diagram of a conventional memory access circuit in a computer system.
Figure 15:
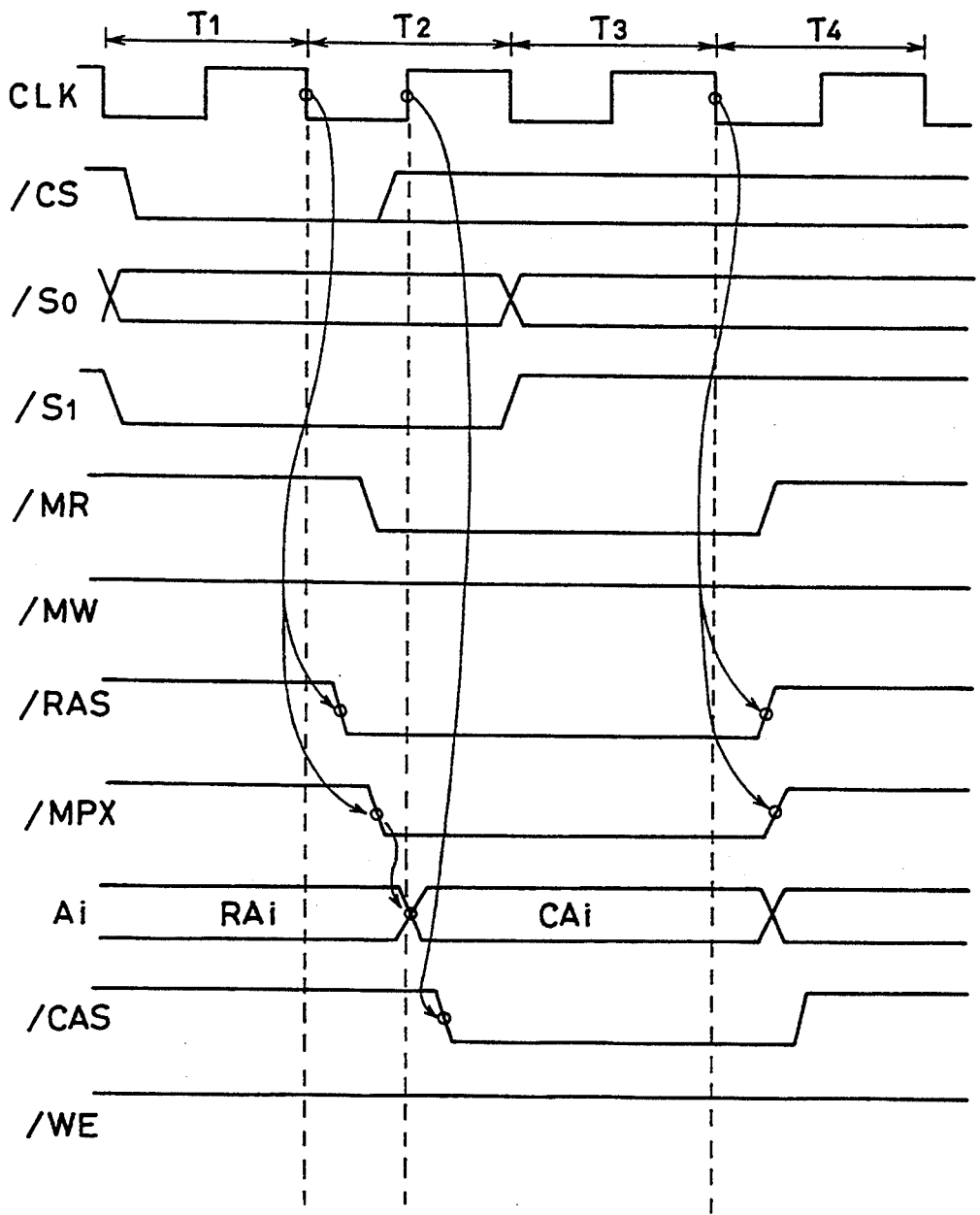
FIG. 15 is a time chart of a read cycle in the memory access circuit shown in FIG. 14.
Figure 16:
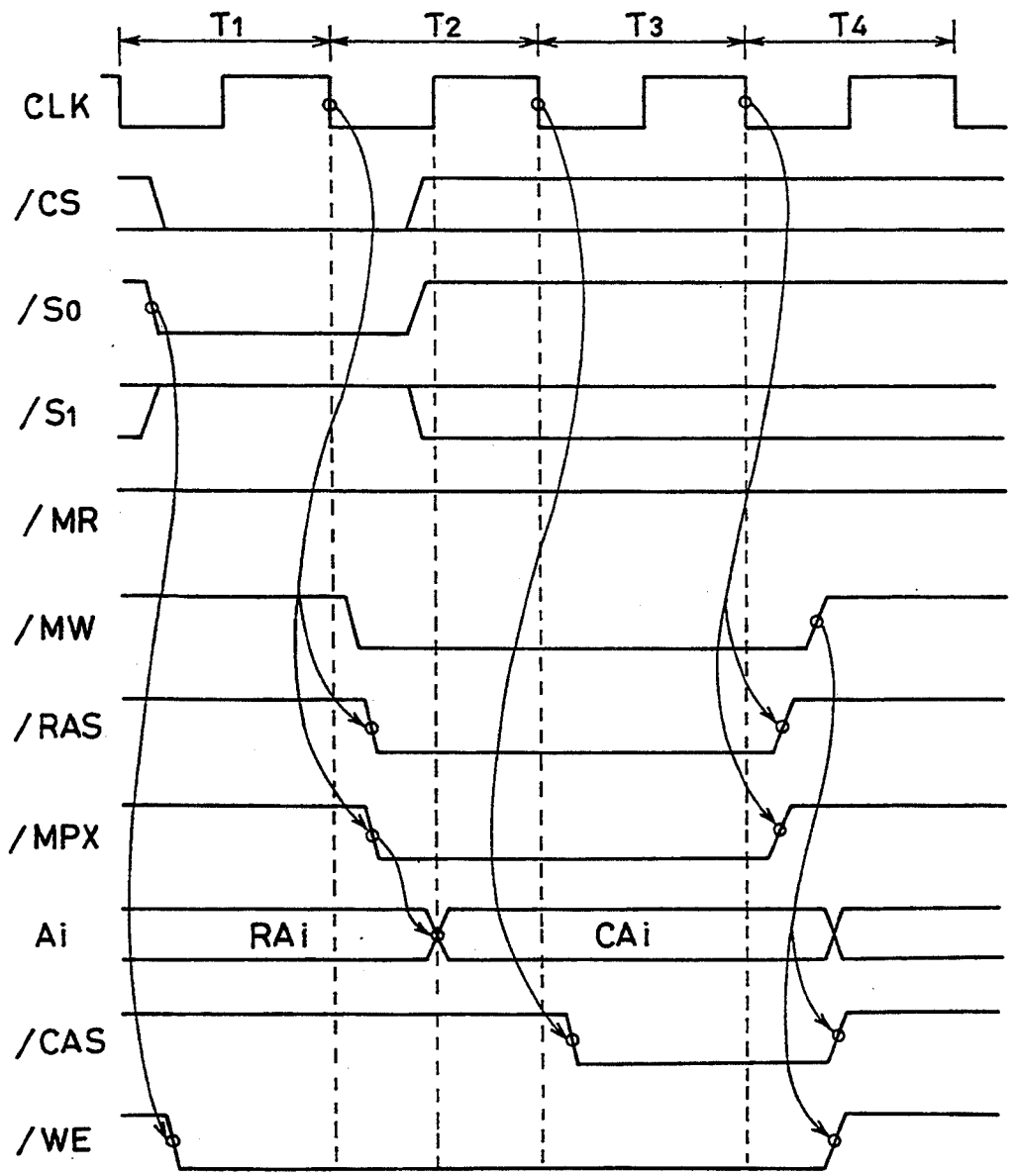
FIG. 16 is a time chart of a write cycle in the memory access circuit shown in FIG. 14.
Figure 17:
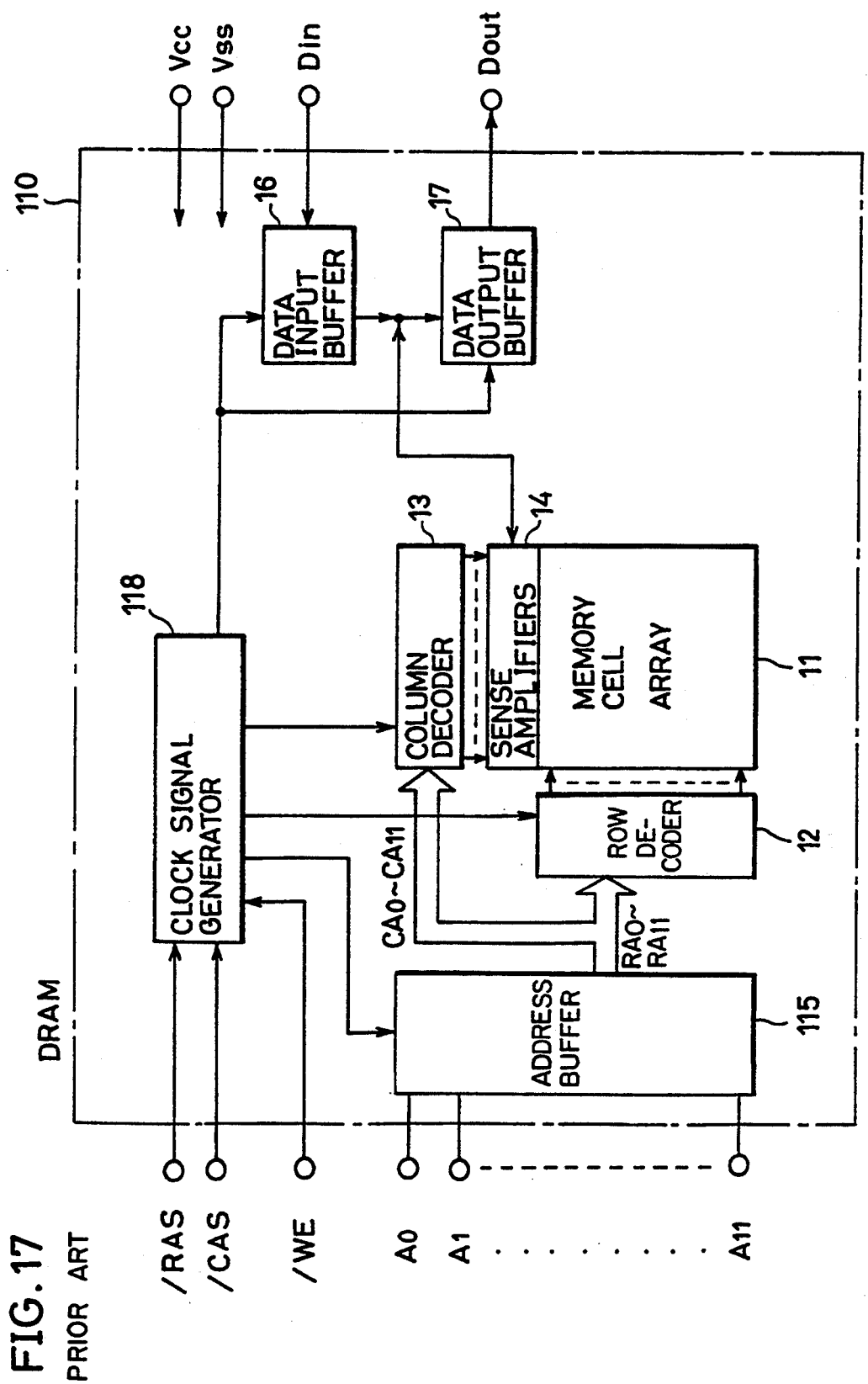
FIG. 17 is a block diagram of a conventional DRAM shown in FIG. 14.
Figure 18:
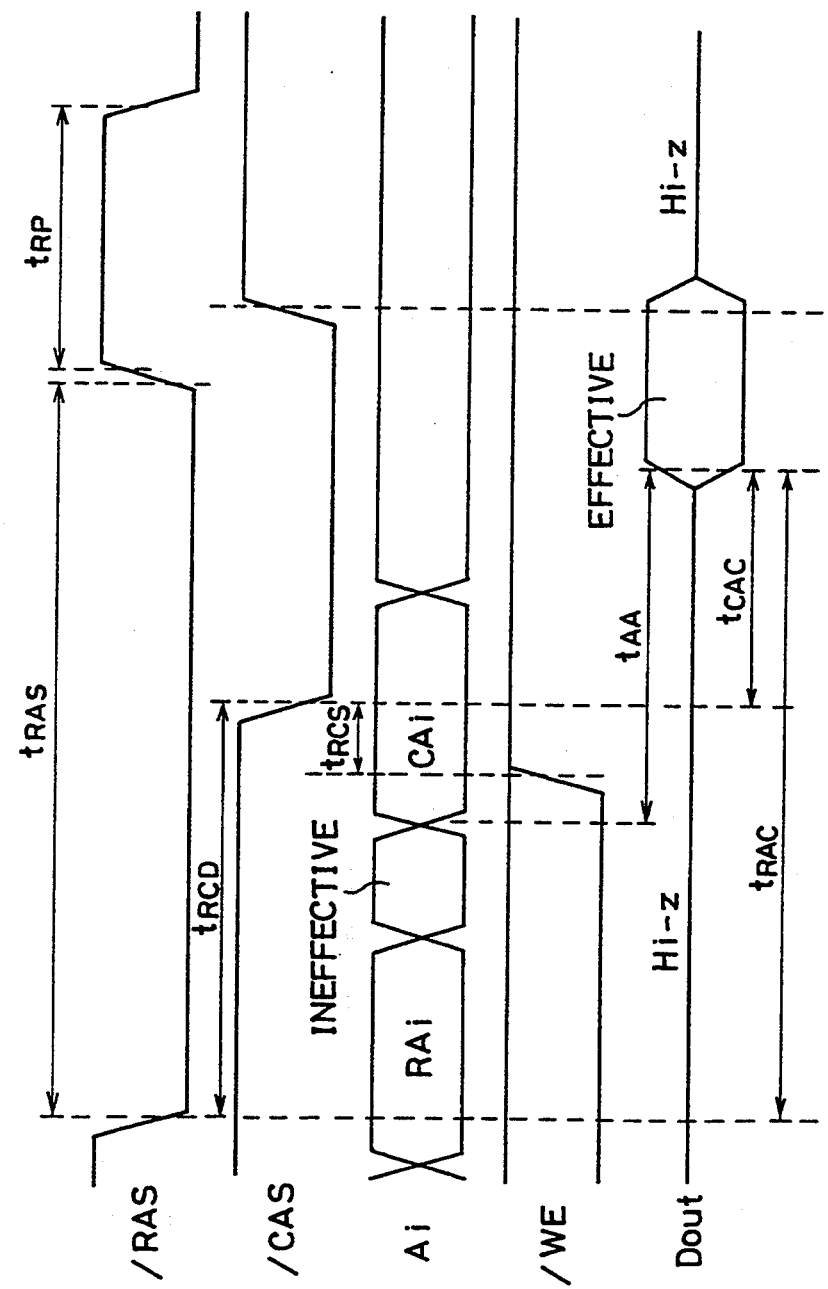
FIG. 18 is a time chart for describing a read operation of the DRAM shown in FIG. 17.
Figure 19:
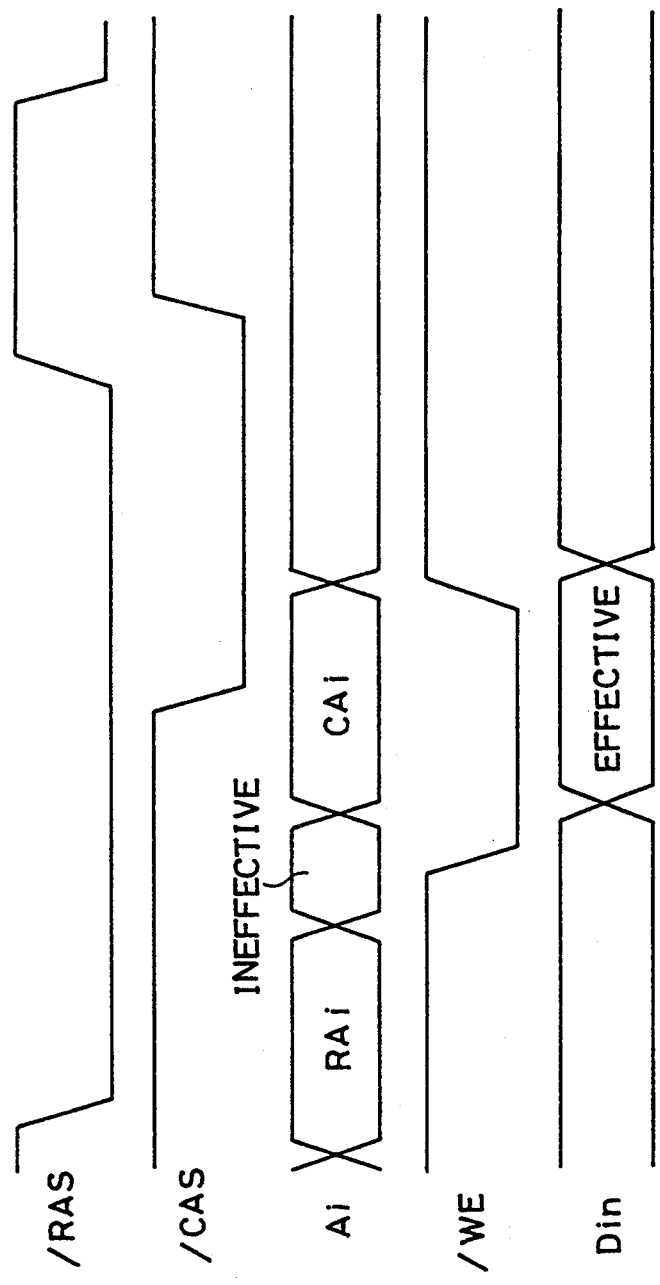
FIG. 19 is a time chart for describing a write operation of the DRAM shown in FIG. 17.
Figure 20:
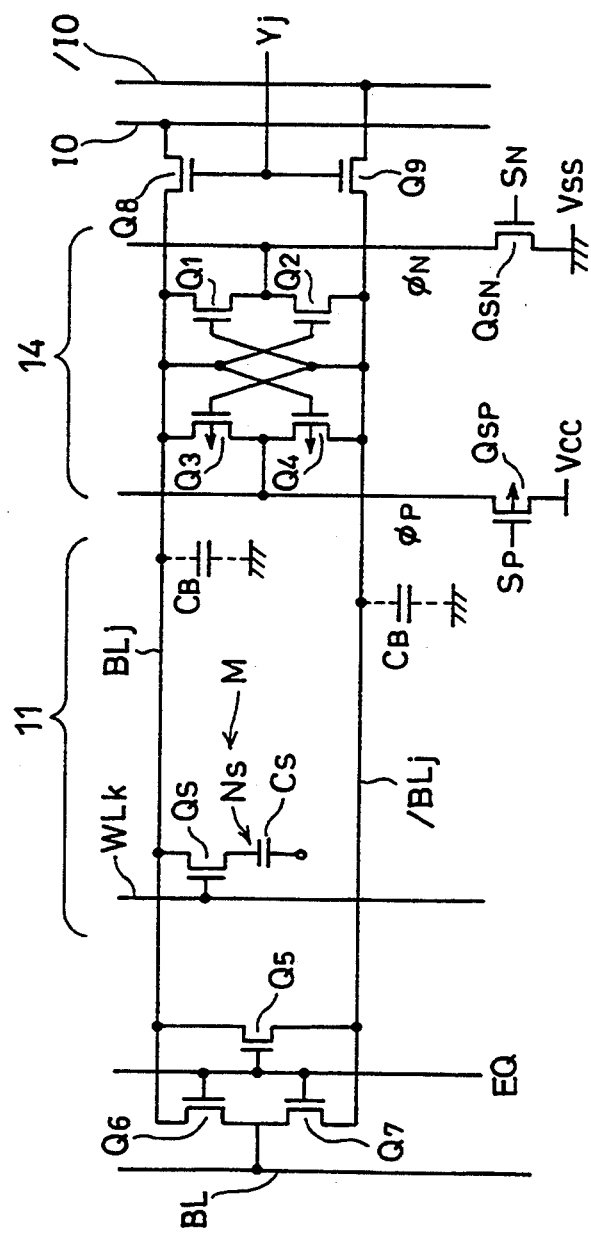
FIG. 20 is a circuit diagram of a memory cell array and its peripheral circuit shown in FIG. 17.
Figure 21:
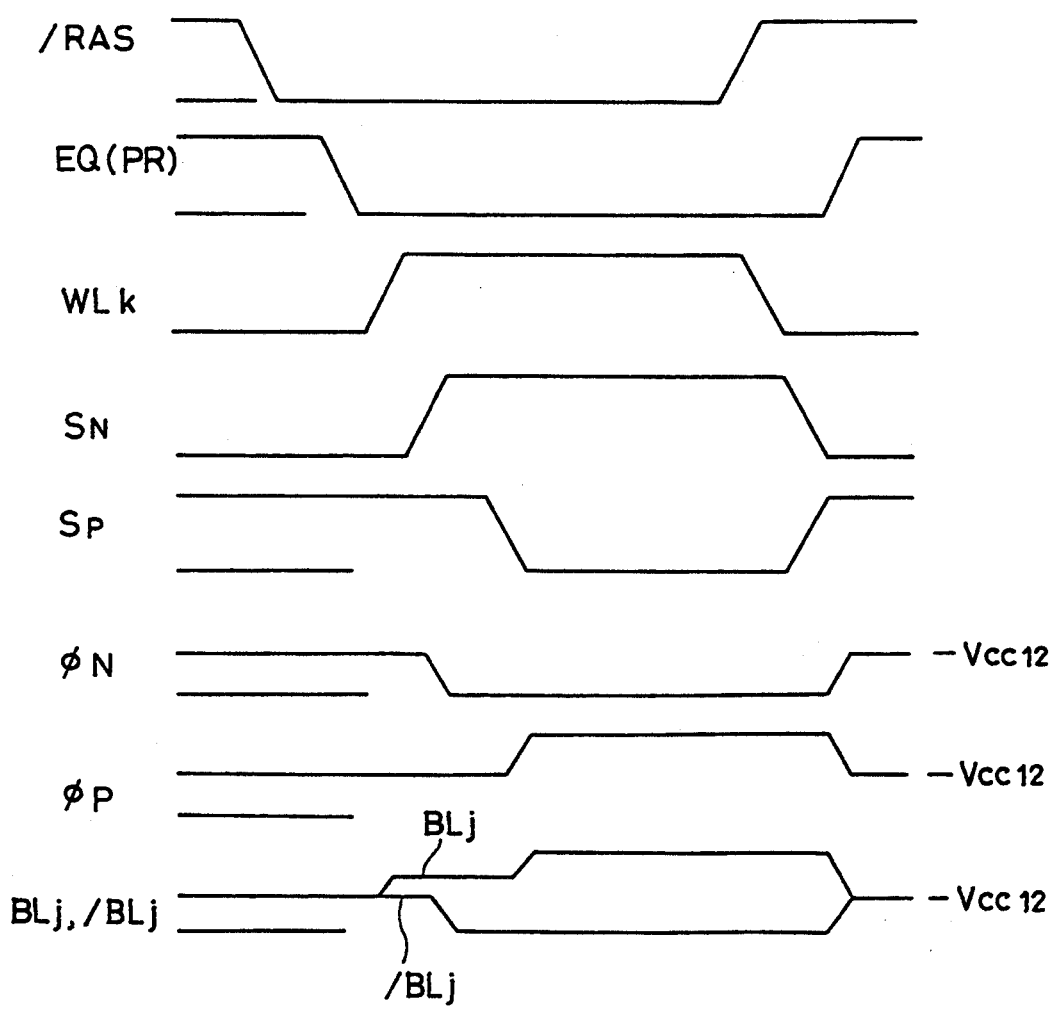
FIG. 21 is a time chart for describing the operation of the circuit shown in FIG. 20.
Figure 22:
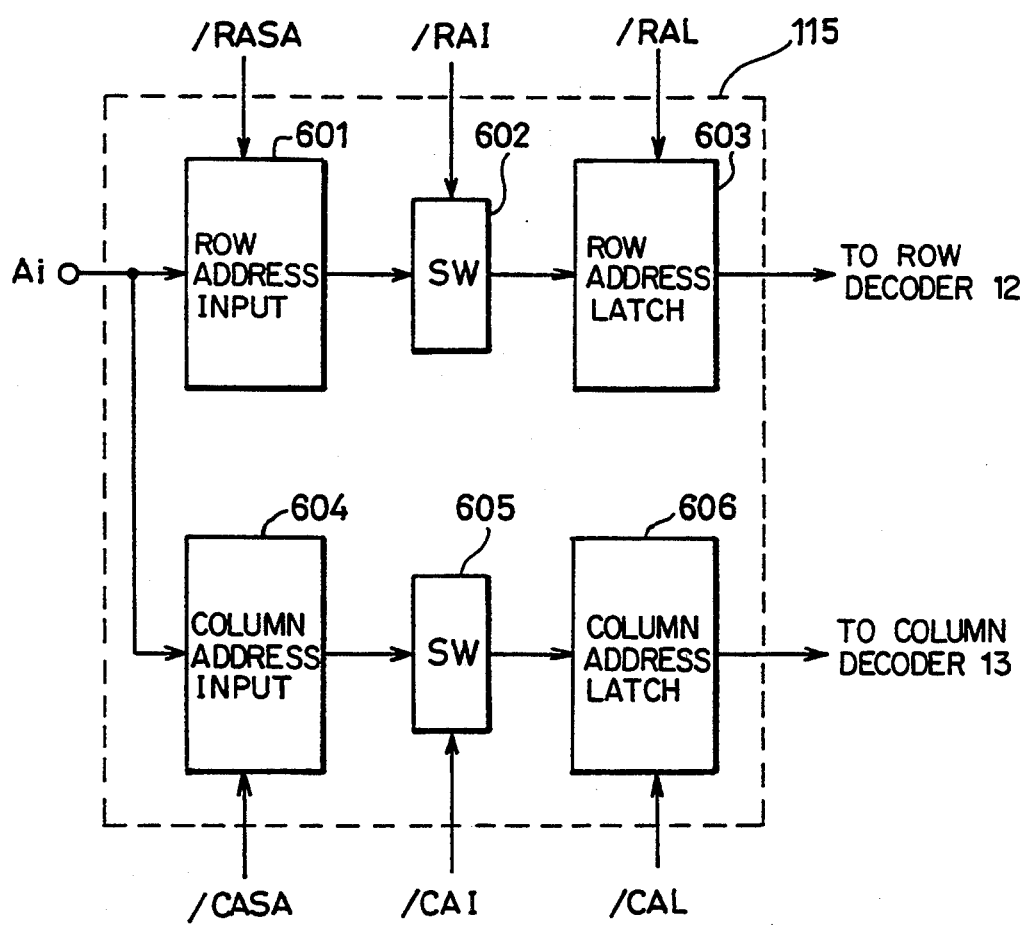
FIG. 22 is a block diagram of an address buffer shown in FIG. 17.
Figure 23:
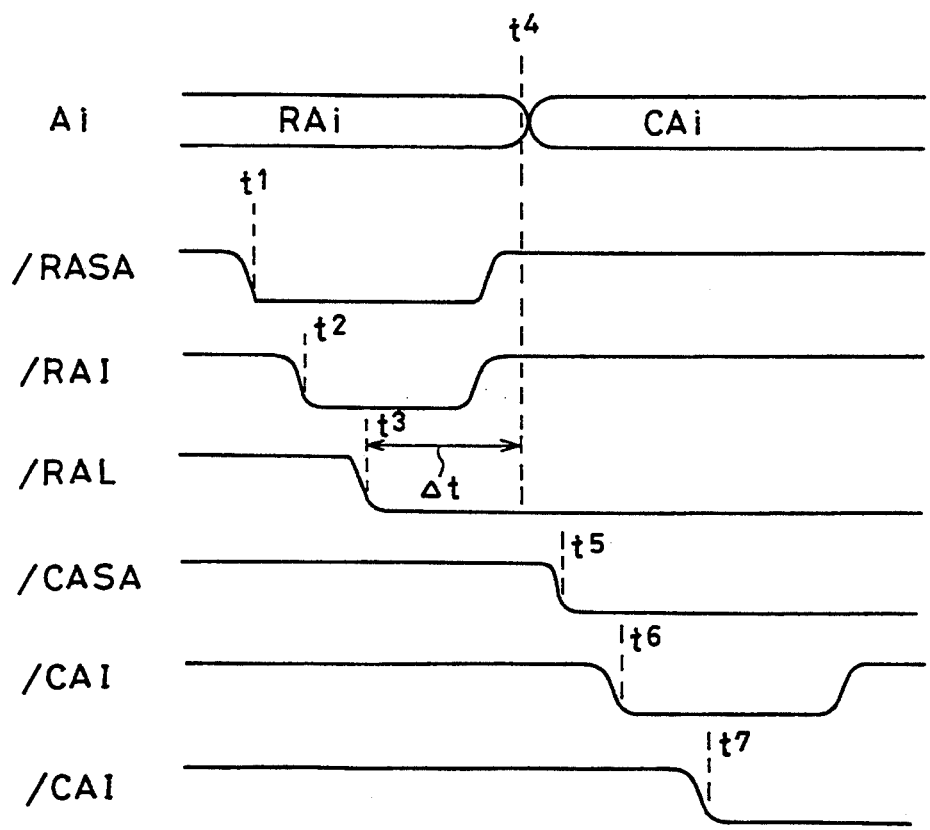
FIG. 23 is a time chart for describing the operation of the address buffer shown in FIG. 22.

Referring to FIG. 1, compared to a conventional memory access circuit shown in FIG. 14, a memory access circuit showing one embodiment of the invention is characterized in that it comprises a four-state address signal generator 5 for generating four-state address signals MA0 through MA11 each having four states and a DRAM 10 operating in response to four-state address signals MA0 through MA11. In the memory access circuit shown in FIG. 1, it is also assumed that DRAM 10 has a memory capacity of 16 megabits. An address converter 3, therefore, receives a virtual address signal VA from a MPU 1 and generates row address signals RA0 through RA11 and column address signals CA0 through CA11 each having 12 bits. Row address signals RA0 through RA11 and column address signals CA0 through CA11 are defined by two states, that is, [1] and [0]. A four-state address signal generator 5 converts row address signals RA0 through RA11 and column address signals CA0 through CA11 having 24 bits in total to four-state address signals MA0 through MA11 having a total of 12 bits. One example of relationships between two-state address signals RA0 through RA11 and CA0 through CA11 and four-state address signals MA0 through MA11 are shown in the following table 1.

TABLE 1

| RAi | 1 | 1 | 0 | 0 |
|---|---|---|---|---|
| CAi | 1 | 0 | 1 | 0 |
| MAi | Vcc | 2Vcc/3 | Vcc/3 | 0 (= Vss) |

Table 1 shows a relationship between an i-th row address signal RAi and an i-th column address signal CAi and an i-th four-state address signal MAi. As can be seen from table 1, a four-address signal MAi has four voltage levels, and a combination of row address signal RAi and column address signal CAi is determined by each voltage level. Therefore, four-state address signals MA0 through MA11 having 12 bits in total are enough to define two-state address signals having 24 bits in total.

Four-state address signals MA0 through MA11 are applied to an address buffer 7 for a four-state signal. After load driving capability of each of four-state address signals MA0 through MA11 is increased, these four-state address signals MA0 through MA11 are applied to DRAM 10.

A timing controller 6 operates similarly to timing controller 106 shown in FIG. 14; however, instead of a switching control signal /MPX, it generates an enable signal ME for enabling conversion of a two-state address signal to a four-state address signal and applies it to four-state address signal generator 5. A detailed description of DRAM 10 will be made later. Since the other circuit shown in FIG. 1 are basically the same as the circuits shown in FIG. 14, a description of them is not repeated.

Figure 2:
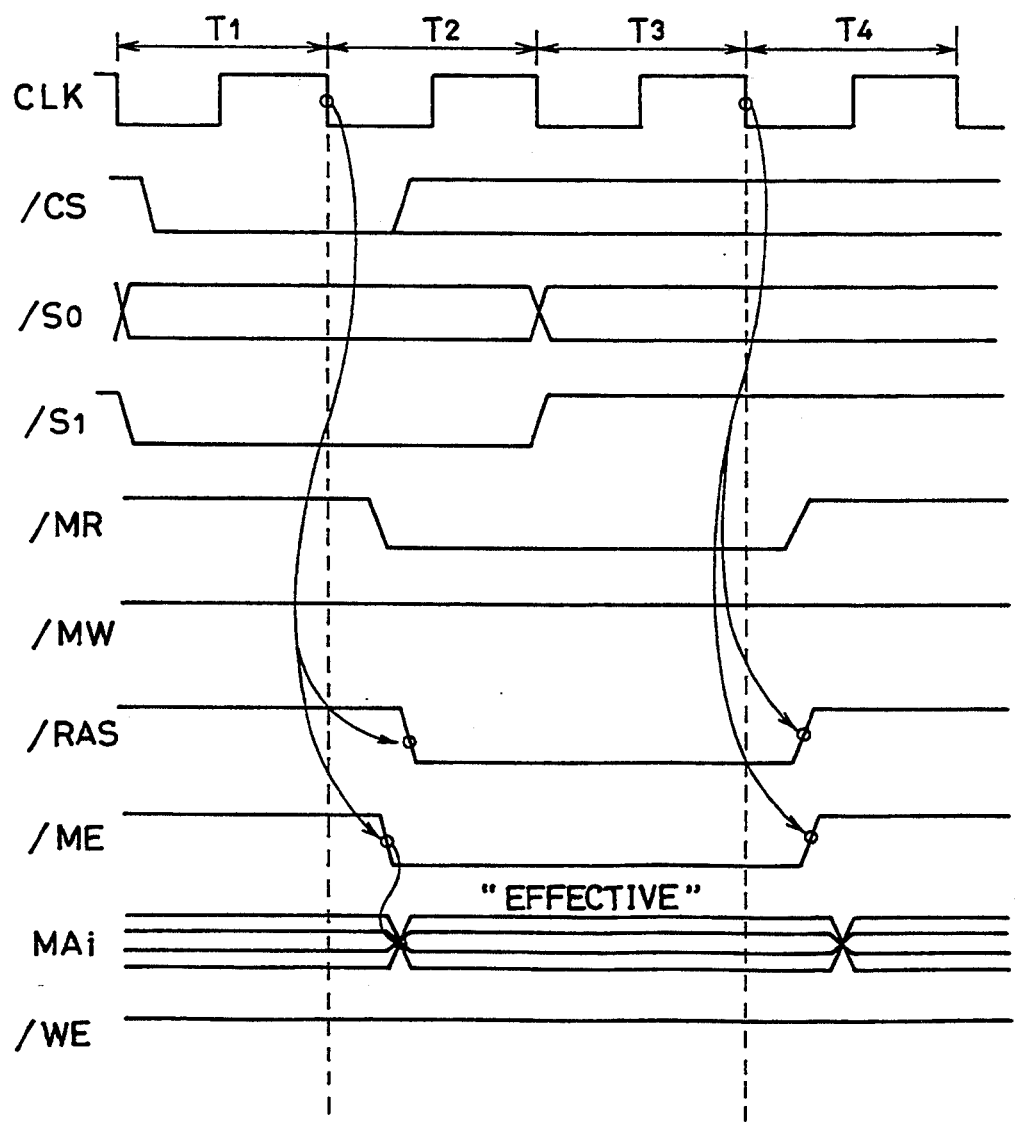
FIG. 2 is a time chart of a read cycle in the memory access circuit shown in FIG. 1.

FIG. 2 is a time chart of a read cycle in the memory access circuit shown in FIG. 1. Referring to FIG. 2, first, state signals /S0 and /S1 are held in response to the first fall of a clock signal CLK. In addition, signals /RAS and /ME fall. Four-state address signal generator 5 converts two-state address signals RAi and CAi to four-state address signal MAi in response to a fall of a conversion enable signal /ME. Therefore, until signal /ME rises again, four-state address signal generator 5 keeps outputting effective four-state address signal MAi. Each of four-state address signals MA0 through MA11 is generated in timing shown in FIG. 2 and applied to DRAM 10.

Figure 3:
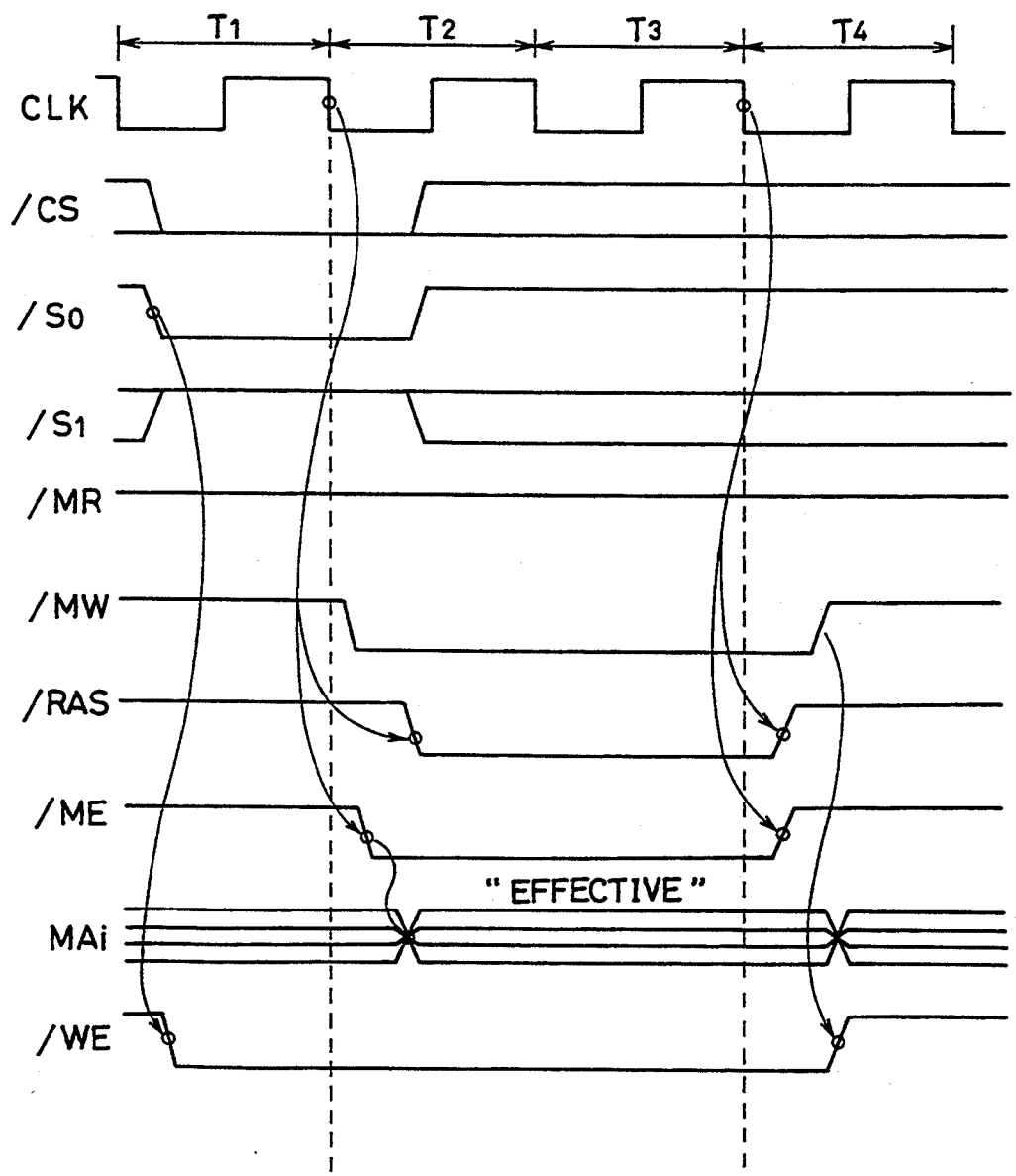
FIG. 3 is a time chart of a write cycle in the memory access circuit shown in FIG. 1.

FIG. 3 is a time chart of a write cycle in the memory access circuit shown in FIG. 1. Referring to FIG. 3, signals /RAS and /ME fall in response to the first fall of clock signal CLK. In response to a fall of conversion enable signal /ME, four-state address signal generator 5 generates effective four-states address signal MAi and keeps outputting it until the next rise of signal /ME.

Figure 4:
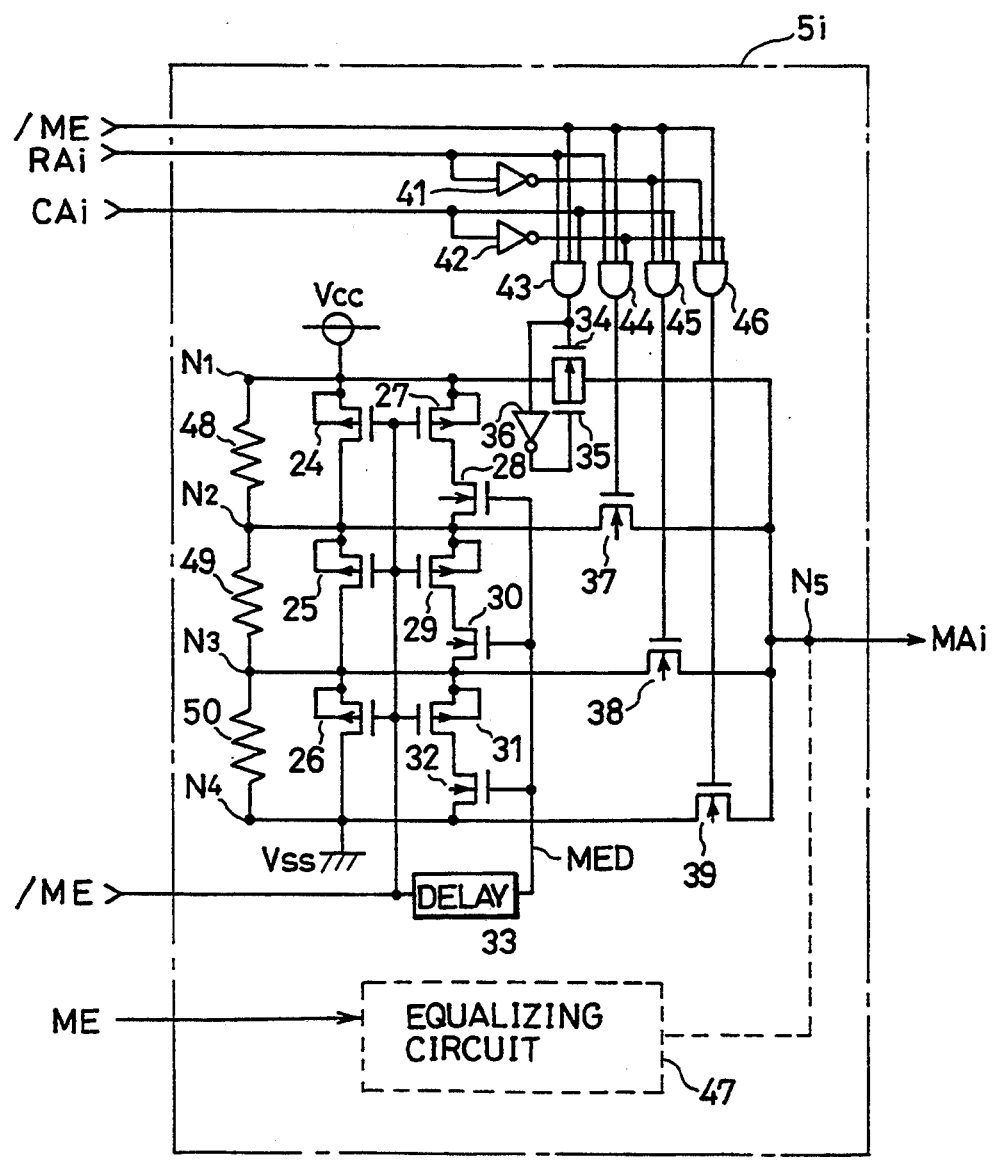
FIG. 4 is a circuit diagram of a four-state address signal generator shown in FIG. 1.

FIG. 4 is a circuit diagram of four-state address signal generator 5 shown in FIG. 1. Only the circuit for performing i-th address signal processing is shown. That is, this circuit 5i converts an i-th row address signal RAi and an i-th column address signal CAi to an i-th four-state address signal MAi. Conversion enable signals ME and /ME are applied from a timing controller 6 shown in FIG. 1.

Referring to FIG. 4, three high resistances 48 through 50 are connected in series between a power supply Vcc and ground. Therefore, nodes N1 through N4 at both ends of respective high resistances 48 through 50 are brought into Vcc, 2Vcc/3, Vcc/3 and 0 (=Vss), respectively. That is, voltage levels for defining four states of four-state address signal MAi are generated by these high resistances 48 through 50. Inverters 41 and 42 and AND gate 43 through 46 constitute a decoder circuit. Two-state row address signal RAi and two-state column address signal CAi are supplied to this decoder. Switching transistors 34 through 39 are connected between corresponding voltage nodes N1 through N4 and output node N5, respectively. A transmission gate formed by an NMOS transistor 34 and a PMOS transistor 35 is connected between nodes N1 and N5 and operates in response to an output signal of AND gate 43. An NMOS transistor 37 connected between nodes N2 and N5 operates in response to an output signal from an AND gate 44. NMOS transistor 38 connected between nodes N3 and N5 operates in response to an output signal from AND gate 45. NMOS transistor 39 connected between nodes N4 and N5 operates in response to an output signal from AND gate 46.

The aforementioned decoder circuit is activated in response to conversion enable signal /ME. One of four AND gates 43 through 46, therefore, outputs a signal at a high level in response to row address signal RAi and column address signal CAi. Therefore, one of four voltages at nodes N1 through N4 is selectively applied to output node N5. The relationship between row address signal RAi and column address signal CAi, and the voltage level of node N5, that is, four-state address signal MAi is the same as the relationship shown in Table 1 which is already described.

In addition to the above function, this four-state address signal generator 5i further comprises a circuit for preventing the generation of overshoot and ringing. PMOS transistors 24 through 26 are connected in series between power supply Vcc and ground Vss. In addition, PMOS transistors 27, 29, 31 and NMOS transistors 28, 30, 32 are connected alternately and in series between power supply Vcc and ground. Each of transistors 24, 25, 26, 27, 29 and 32 has its gate connected to receive signal ME. Transistors 28, 30, 32 have their gates connected to receive a signal MED delayed by a delay device 33.

Figure 5:
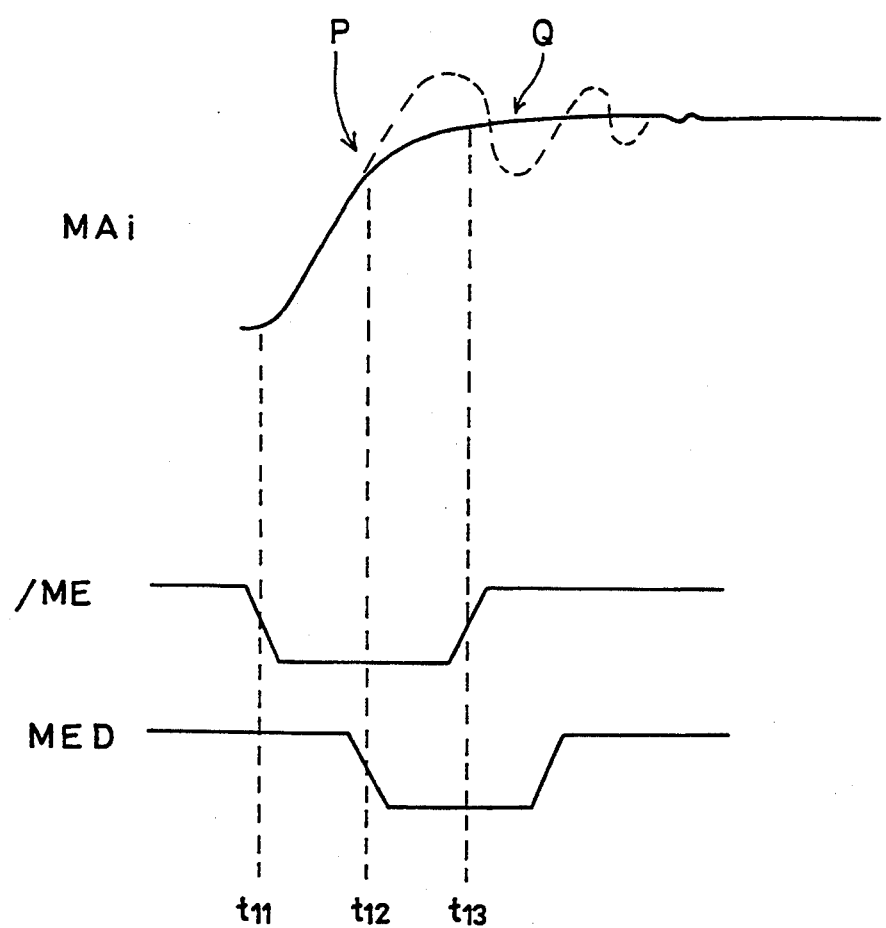
FIG. 5 is a time chart for describing the operation of the circuit shown in FIG. 4.

FIG. 5 is a time chart for describing the prevention of overshoot and ringing which might occur in circuit 5i shown in FIG. 4. Referring to FIGS. 4 and 5, conversion enable signal /ME falls at time t11. Signal MED delayed by delay device 33 falls at time t12. At time t13 signal /ME rises again. In a period between time t11 and t12, all transistors 24 through 32 are turned on. Subsequently, in a period between time t12 and t13, transistors 28, 30, 32 are turned off. After time t13, all transistors 24 through 32 are turned off. As a result, the output waveform of four-state address signal MAi shown with a curve Q in FIG. 5 is obtained. A curve P shows a waveform, when the above mentioned function of preventing overshoot and ringing is not provided, for reference.

Referring again to FIG. 4, it is desirable to provide an equalizing circuit 47 within four-state address signal generator 5i in some cases. Equalizing circuit 47 is connected to output node N5 and operates in response to conversion enable signal ME.

Figure 6:
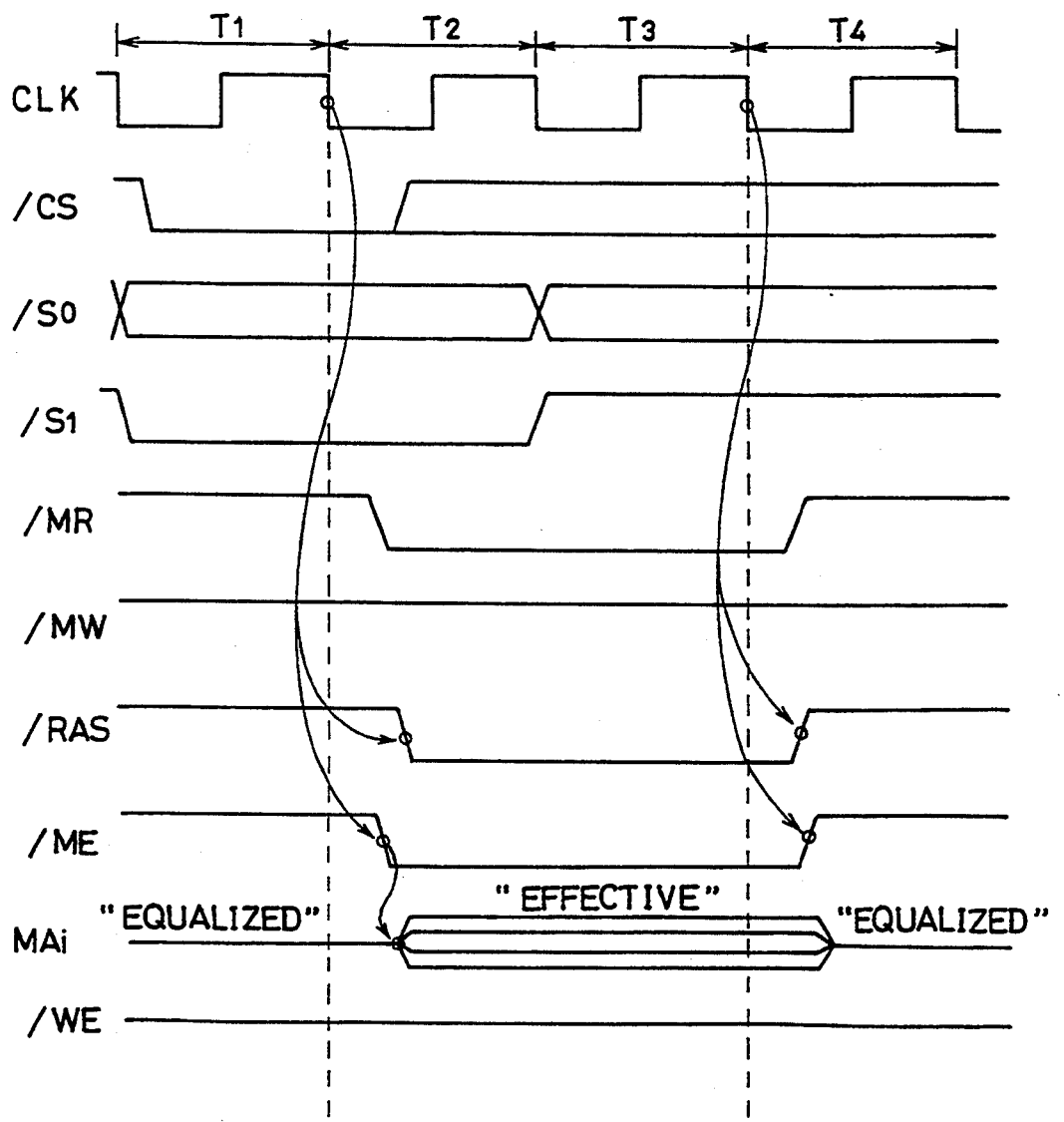
FIG. 6 is a time chart of a read cycle in a case where an equalizing circuit shown in FIG. 4 is added.
Figure 7:
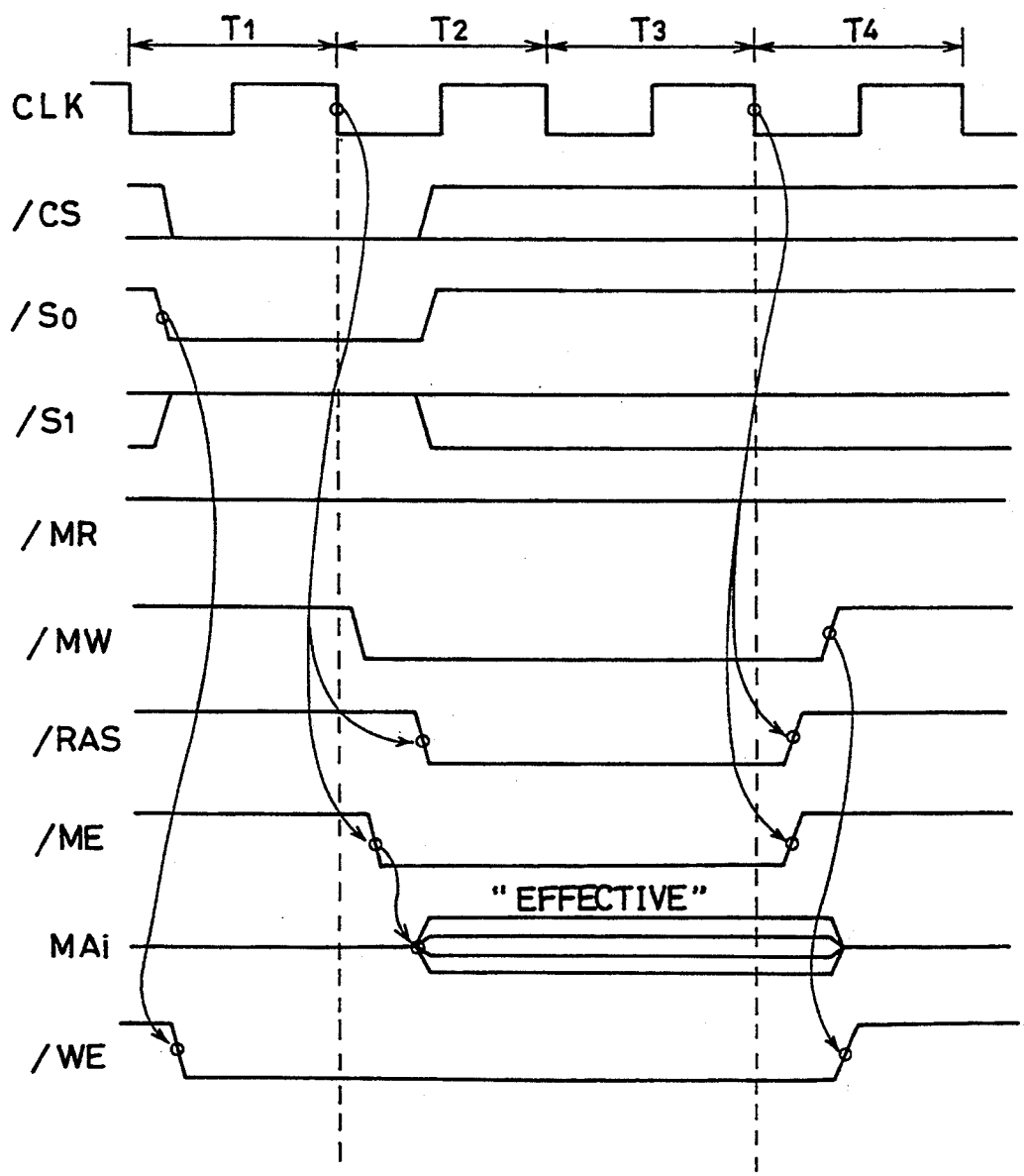
FIG. 7 is a time chart of a write cycle in a case where an equalizing circuit shown in FIG. 4 is added.

FIGS. 6 and 7 are time charts showing a read cycle and a write cycle, respectively, in a case where equalizing circuit 47 shown in FIG. 4 is added. Referring to FIG. 6, equalizing circuit 47 operates in response to signal ME at a high level, so that signal MAi is equalized before and after effective four-state address signal MAi is output. That is, the voltage level of four-state address signal MAi is held at an intermediate value. As a result, it is possible to output effective four-state address signal MAi quickly after equalizing. Similar effect can be obtained in a write cycle shown in FIG. 7.

It has been described that four-state address signals MA0 through MA11 necessary to access DRAM 10 are generated in the memory access circuit shown in FIG. 1. Various advantages which can be obtained will be described by making a detailed description of DRAM 10.

Figure 8:
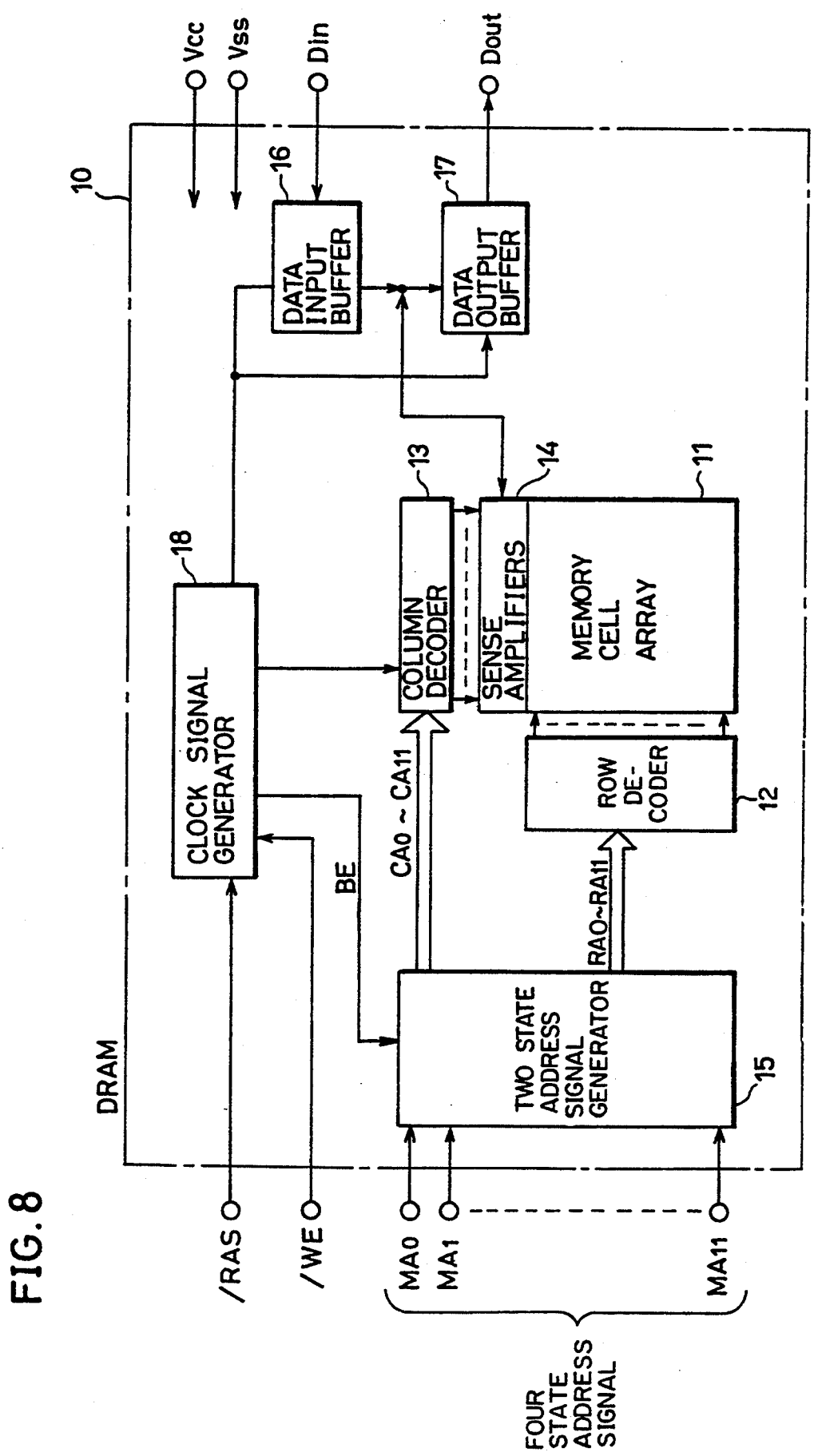
FIG. 8 is a block diagram of a DRAM shown in FIG. 1.

FIG. 8 is a block diagram of DRAM 10 shown in FIG. 1. Referring to FIG. 8, this DRAM 10 comprises a two-state address signal generator 15 connected to receive four-state address signals MA0 through MA11 generated from the memory access circuit. Two-state address signal generator 15 converts four-state address signals MA0 through MA11 to row address signals RA0 through RA11 and column address signals CA0 through CA11 each defined by two states. Converted row address signals RA0 through RA11 are applied to a row decoder 12. Two-state column address signals CA0 through CA11 are applied to a column decoder 13. It is also pointed out that this DRAM 10 does not need a signal /CAS. A clock signal generator 18 operates in response to signals /RAS and /WE and generates various clock signals necessary to control the operation in DRAM 10.

Two-state address signal generator 15 converts four-state address signals MA0 through MA11 to two-state address signals RA0 through RA11 and CA0 through CA11. The relationship between a four-state address signal and two-state address signal is the same as the relationship shown in Table 1 which is already described. That is, two-state address signal generator 15 outputs i-th row address signal RAi and i-th column address signal CAi in response to the voltage level of i-th four-state address signal MAi.

Figure 9:
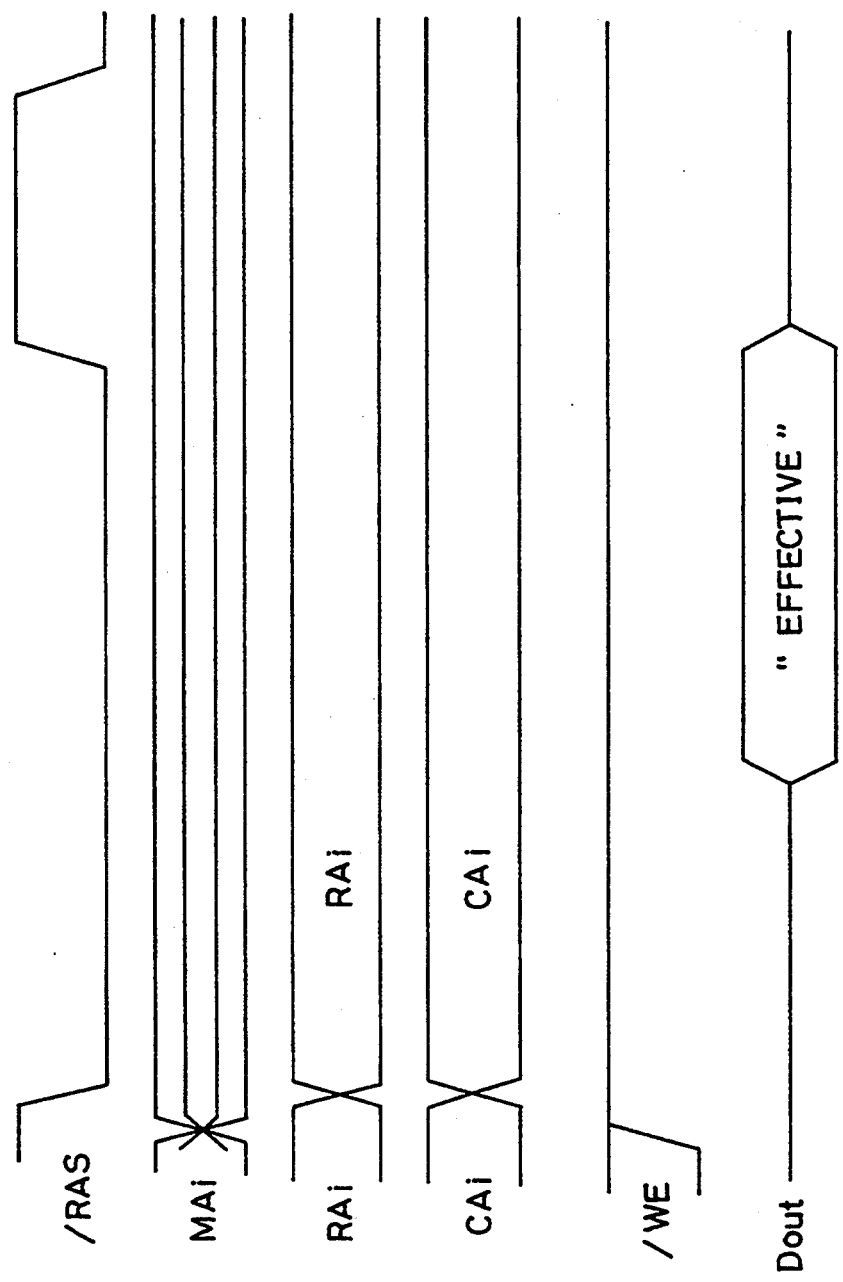
FIG. 9 is a time chart for describing a read operation of a DRAM shown in FIG. 8.

FIG. 9 is a time chart for describing a read operation of DRAM 10 shown in FIG. 8. Referring to FIG. 9, after a signal /WE rises, a read operation starts by a fall of a signal /RAS. Two-state address signal generator 15 converts four-state address signal MAi to two-state address signals RAi and CAi in response to a fall of signal /RAS. Therefore, row address signal RAi and column address signal CAi can be obtained almost simultaneously and they are supplied to row decoder 12 and column decoder 13. Row decoder 12 activates one word line in response to row address signals RA0 through RA11. After sense amplifier 14 amplifies a data signal stored in a memory cell, column decoder 13 selects one column in response to column address signals CA0 through CA11. Therefore, read data Dout is output through a data output buffer 17. An output data terminal is brought into high impedance state when effective output data Dour is not output.

Figure 10:
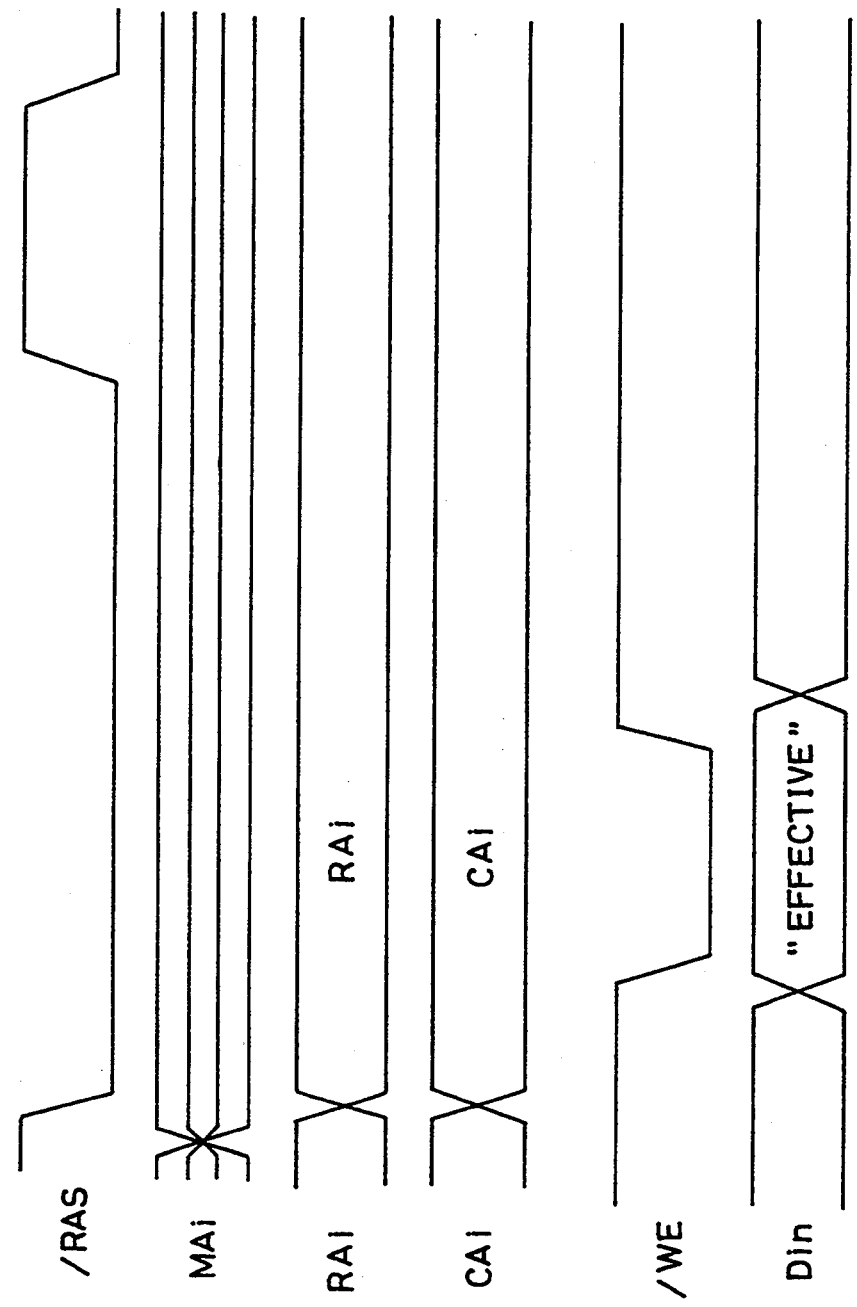
FIG. 10 is a time chart for describing a write operation of the DRAM shown in FIG. 8.

FIG. 10 is a time chart for describing a write operation of the DRAM 10 shown in FIG. 8. Similarly to a read operation, two-state address signal generator 15 converts four-state address signals MA0 through MA11 to two-state address signals RA0 through RA11 and CA0 through CA11 in response to a fall of signal /RAS. The converted two-state address signals are supplied to row decoder 12 and column decoder 13, and a memory cell in which an input data signal Din is to be written is designated.

Figure 11:
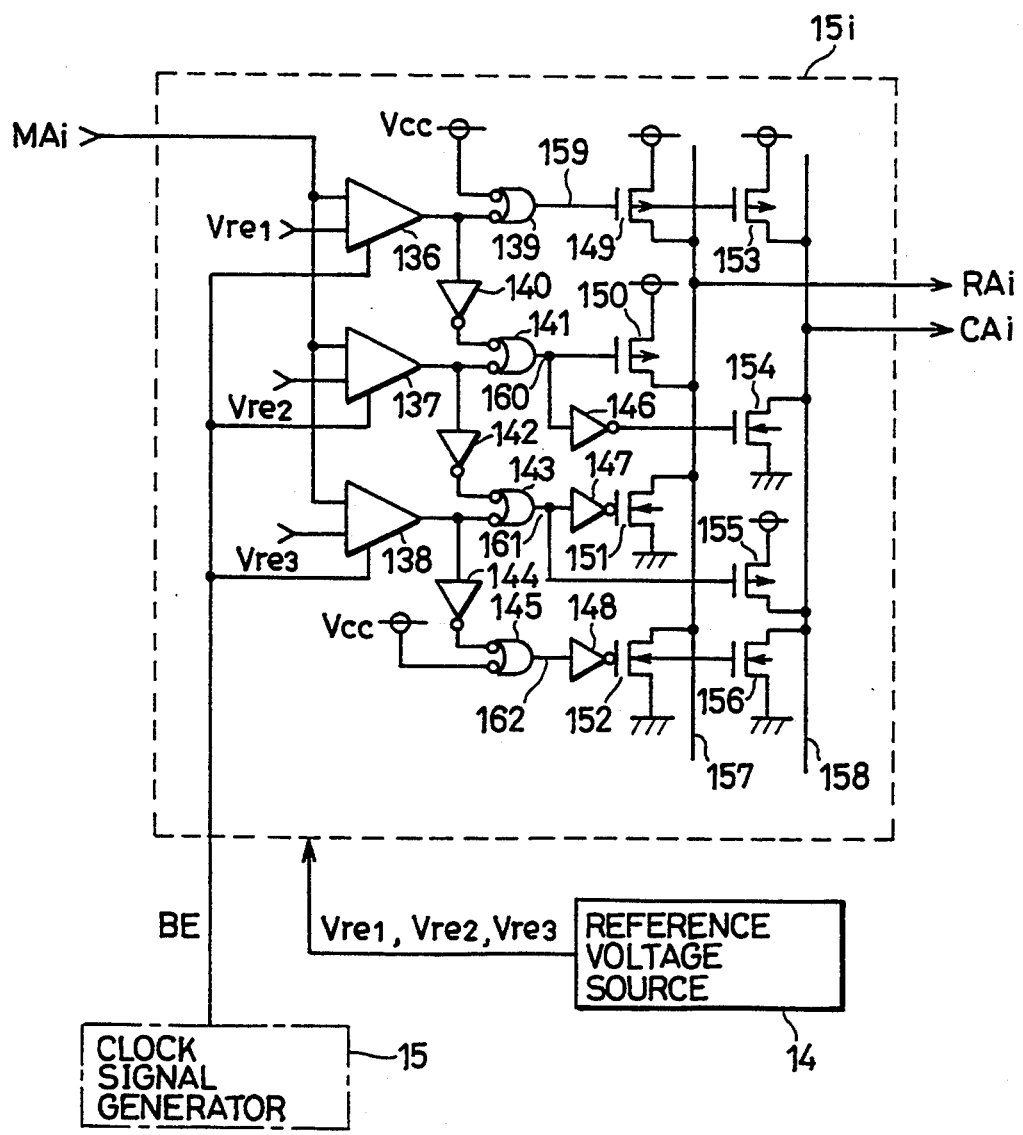
FIG. 11 is a circuit diagram of a two-state address signal generator shown in FIG. 8.

FIG. 11 is a circuit diagram of two-state address signal generator 15 shown in FIG. 8. Only the part which performs i-th address signal conversion is also shown in this figure. That is, a circuit 15i converts i-th four-state address signal MAi to i-th two-state row address signal RAi and two-state column address signal CAi.

Referring to FIG. 11, two-state address signal generating circuit 15i comprises three comparators 136, 137, 138 for comparing a voltage level of four-state address signal MAi with three reference voltage levels Vre1, Vre2, Vre3 respectively. A NOR gate 139 receives an output signal of a power supply voltage Vcc and comparator 136. A NOR gate 141 receives an output signal of an inverter 140 and comparator 137. A NOR gate 143 receives an output signal of an inverter 142 and comparator 138. A NOR gate 145 receives an output signal of an inverter 144 and power supply voltage Vcc. Circuit 15i further comprises a signal line 157 for outputting two-state row address signal RAi and a signal line 158 for outputting two-state column address signal CAi. PMOS transistors 149 and 150 are connected between power supply Vcc and signal line 157. NMOS transistors 151 and 152 are connected between signal line 157 and ground. PMOS transistors 153 and 155 are connected between power supply Vcc and signal line 158. NMOS transistors 154 and 156 are connected between signal line 158 and ground. Each of transistors 149 through 156 are connected to receive an output signal or an inverted output signal from NOR gates 139, 141, 143, 145.

Reference voltage source 14 generates three reference voltages Vre1, Vre2, Vre3. The voltage levels of these reference voltages are set as follows. Voltage Vre1 are set at the intermediate value between Vcc and 2Vcc/3. Reference voltage Vre2 is set at the intermediate value between 2Vcc/3 and Vcc/3, that is, Vcc/2. Reference voltage Vre3 is set at the intermediate value between Vcc/3 and Vss, that is, Vcc/6.

Clock signal generator 15 generates conversion enable signal BE in response to the fall of signal /RAS. Comparators 136, 137, 138 each start the comparison operation in response to signal BE. Comparator 136 compares a voltage level of four-state address signal MAi with reference voltage Vre1. Comparator 137 compares the voltage level of signal MAi with reference voltage Vre2. Comparator 138 compares the voltage level of signal MAi with voltage Vre3. If, for example, four-state address signal MAi has a voltage level of Vcc, each of comparators 136, 137, 138 output voltages at high levels, and therefore all NOR gates 139, 141, 143, 145 output the high level voltages and signal lines 157 and 158 are brought into the high level voltage. As a result, signals both at high levels are output as row address signal RAi and column address signal CAi. In another example, if four-state address signal MAi having a voltage level of 2Vcc/3 is applied, comparator 136 output a signal at a low level and comparators 137 and 138 outputs signals at high levels. Therefore, NOR gates 139 and 141 output signals at low levels, and NOR gates 143 and 145 output signals at high levels. As a result, transistors 150 and 154 are turned on, signal line 157 has the high level voltage, and signal line 158 has the low level voltage. A voltage at a high level is output as row address signal RAi and a voltage at a low level is output as column address signal CAi.

Various advantages of the DRAM 10 shown in FIG. 8 will be described below. First, it is pointed out that an address multiplexing system is not adopted in DRAM 10. As mentioned above, four-state address signals MA0 through MA11 are supplied to this DRAM 10 and then converted to two-state address signals RA0 through RA11 and CA0 through CA11, and therefore it is not necessary to apply a row address signal and a column address signal time sharing in a time division multiplexing manner. Therefore, a difficulty in timing in which a row address signal is latched by an address buffer, which is created in a conventional DRAM, can be avoided. This implies that accurate addressing can be secured under the requirement of high speed operation. In addition, it is also pointed out that the number of address input pins is not increased in DRAM 10. It was not possible to avoid increasing the number of address input pins when an address nonmultiplexing system was adopted in a conventional DRAM, however, this DRAM 10 does not require an increase of the number of address input pins. This means that a larger package is not needed. In addition to these advantages, an advantage which can be obtained in terms of power consumption of a DRAM will be described below.

Figure 12:
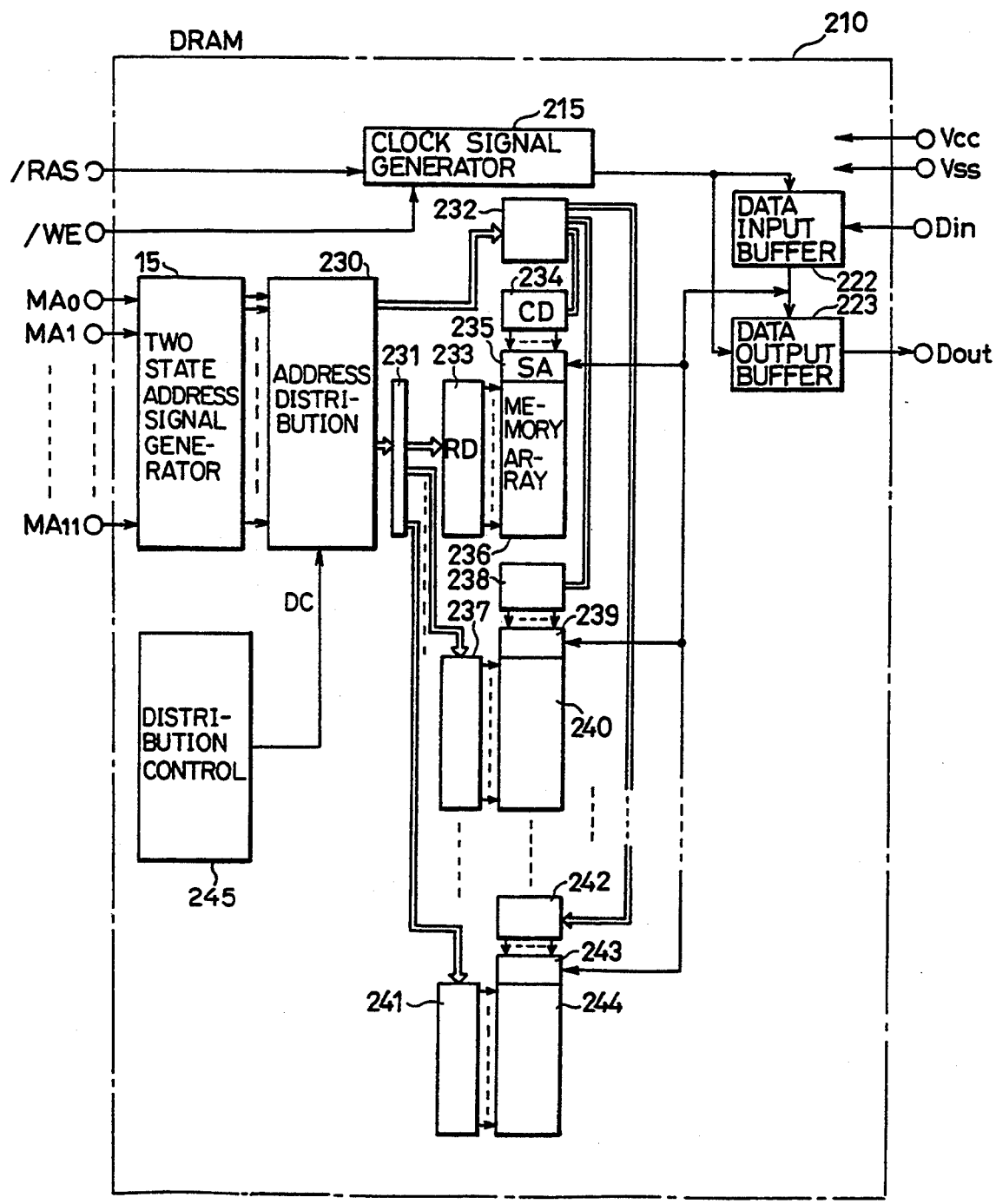
FIG. 12 is a block diagram of a DRAM showing another embodiment of the invention.

FIG. 12 is a block diagram of a DRAM 210 showing another embodiment of the invention. Referring to FIG. 12, this DRAM 210 comprises two-state address signal generator 15, an address distributing circuit 230 distributing a generated two-state address signal to a row address signal and a column address signal, a row address control circuit 233 controlling supply timing of the distributed address signals to the decoder, memory arrays 236, 240 and 244 divided into a plurality, a distribution control circuit 245 generating a distribution control signal DC for controlling distribution of address signals. Distribution control circuit 245 generates distribution control signal DC according to a program stored therein.

Figure 13:
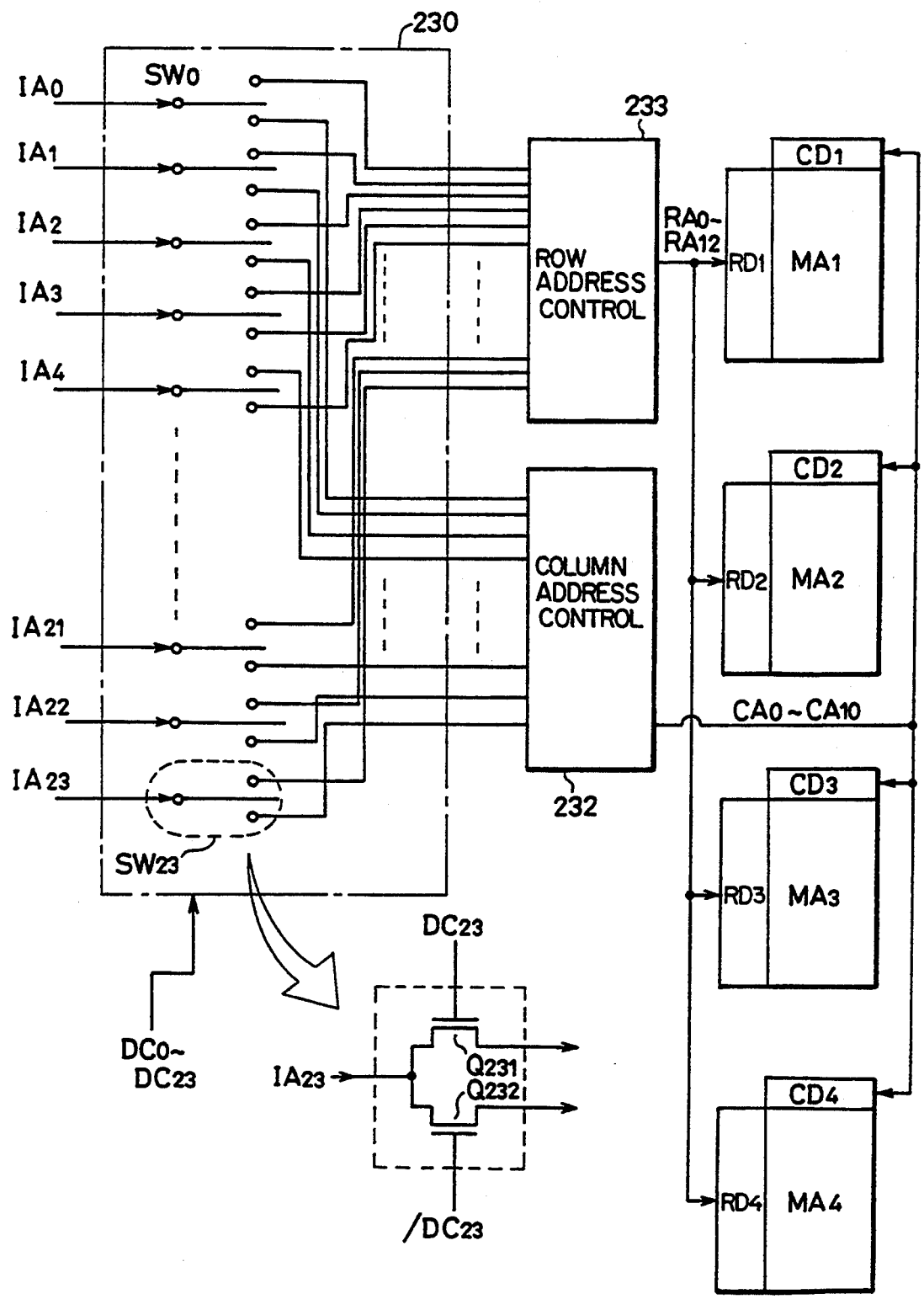
FIG. 13 is a circuit diagram of an address distributing circuit shown in FIG. 12.

FIG. 13 is a circuit diagram of an address distributing circuit 230 shown in FIG. 12. Referring to FIG. 13, address distributing circuit 230 comprises switches SW0 through SW23 connected to receive internal address signals IA0 through IA23 of 24 bits, respectively, generated from two-state address signal generator 15 shown in FIG. 12. In DRAM 10 shown in FIG. 8, two-state address signal generator 15 simultaneously generates row address signals RA0 through RA11 and column address signals CA0 through CA11 having 24 bits in total. In DRAM 210 shown in FIG. 13, the use of internal address signals IA0 through IA23 is determined by address distributing circuit 230. Switches SW0 through SW23 are controlled, respectively, by switching control signals DC0 through DC23 applied from distribution control circuit 245, whereby the use is determined. While an internal address signal to be used for row addressing is applied to row address control circuit 233, an internal address signal to be used for column addressing is applied to column address control circuit 232. In the following description, by way of an example, it is assumed that out of a total of 24 bits of internal address signals, 13 bits are used for row addressing, 11 bits are used for column addressing. In addition, it is also assumed that memory cell array is divided into four parts MA1 through MA4. Therefore, row address signals RA0 through RA12 of 13 bits are supplied to four row decoders RD1 through RD4 and column address signals CA0 through CA10 of 11 bits are supplied to four column decoders CD1 through CD4.

One switch circuit, for example a switch circuit SW23, is structured by two NMOS transistors Q231 and Q232 as shown in FIG. 13. Either of these transistors Q231 and Q232 is turned on in response to control signals DC23 and /DC23, and internal address signal IA23 is applied to either of row address control circuit 233 and column address control circuit 232. Distribution control circuit 245 generates switching control signals DC0 through DC23 by, for example, melting a fuse for a program provided therein.

As can be seen from FIGS. 9 and 10, internal address signals IA0 through IA23 can be obtained soon after signal /RAS falls. Since an address multiplexing system is not used, the internal address signals which can be used either for row address signals or for column address signals can be obtained immediately after signal /RAS falls. Therefore, it is pointed out that the internal address signals IA0 through IA23 can be used either for row address signals or for column address signals.

Figure 24A:
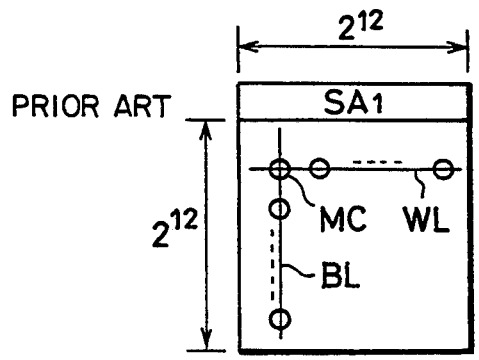
FIG. 24 is a schematic diagram showing the number of memory cells arranged in a memory cell array.
Figure 24B:
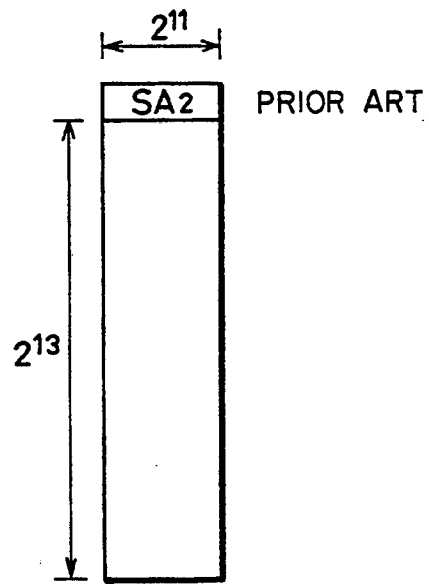

Signals RA0 through RA12 of 13 bits are supplied as row address signals and signals CA0 through CA10 of 11 bits are supplied as column address signals, as an example shown in FIG. 13, and therefore the number of memory cells connected to one word line can be reduced. As shown in FIG. 24(B), $2^{11}$ (=2048) memory cells are connected to one word line and $2^{13}$ (=8192) memory cells are connected to one bit line. As the number of memory cells in a word line direction is reduced to a half compared to FIG. 24(A), the number of sense amplifiers is reduced to a half. This means that sense amplifiers SA2 which are half in number compared to the case shown in FIG. 24(A) are activated in order to amplify a data signal obtained by the activation of one word line. As the number of activated sense amplifiers is reduced to a half, the power consumed by sense amplifiers are also reduced to a half.

Figure 24C:
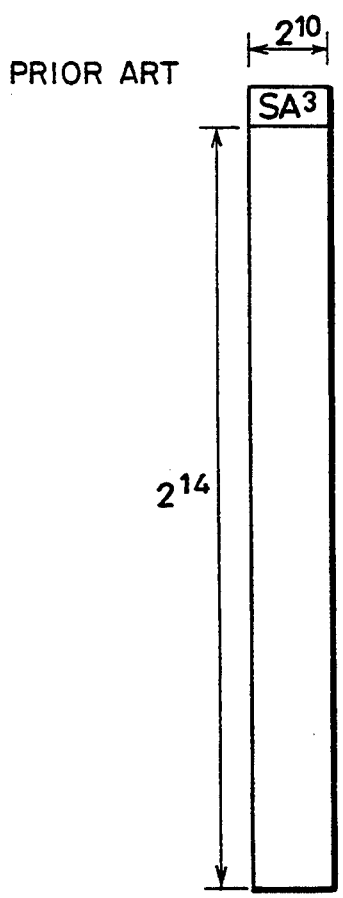
Figure 26:
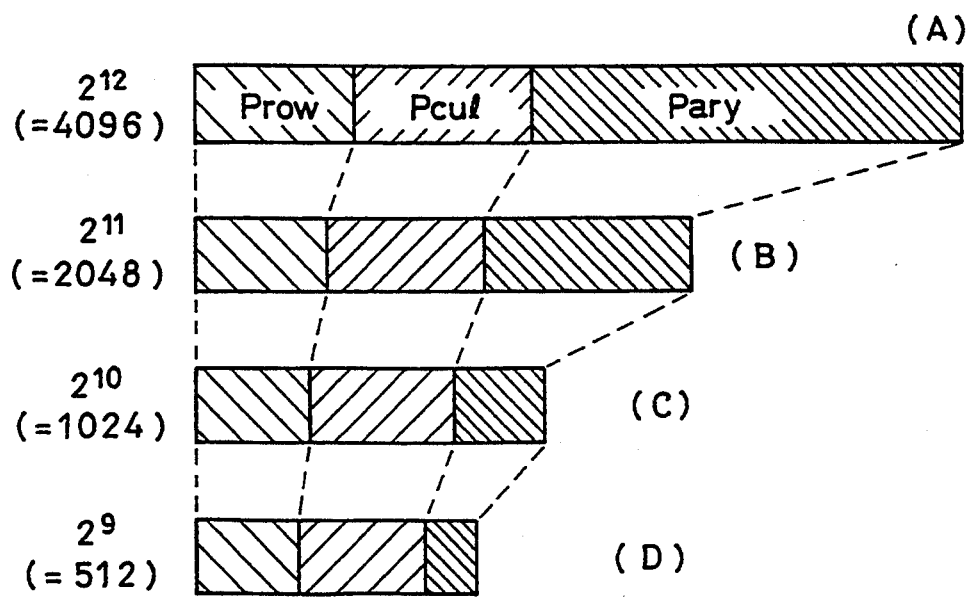
FIG. 26 is a graph showing power consumption of a DRAM.

In a further embodiment, internal address signals IA0 through IA23 of 24 bits are distributed to row address signals RA0 through RA13 of 14 bits and column address signals CA0 through CA9 of 10 bits. In this example, therefore, as shown in FIG. 24(C), $2^{10}$ (=1024) memory cells are connected in a word line direction, and $2^{14}$ (=16384) memory cells are connected in a bit line direction. The number of sense amplifiers SA3 is reduced to a half compared to FIG. 24(B), so that the power consumed in the memory cell array is further reduced to a half as shown in FIG. 26(C). FIG. 26(D) shows an example where the number of memory cells in a word line direction is further reduced to a half.

As can be understood by comparing FIG. 26(A) through (D), it is pointed out that power consumption in a memory cell array can be decreased in proportion to the decreased number of memory cells in a word line direction. As described above, a large part of power consumption in a memory cell array is used for activating sense amplifiers. Accordingly, it is understood that reduction of the number of sense amplifiers activated in connection with the selection of one word line is helpful for substantially reducing the total consumption current in a DRAM.

Figure 25:
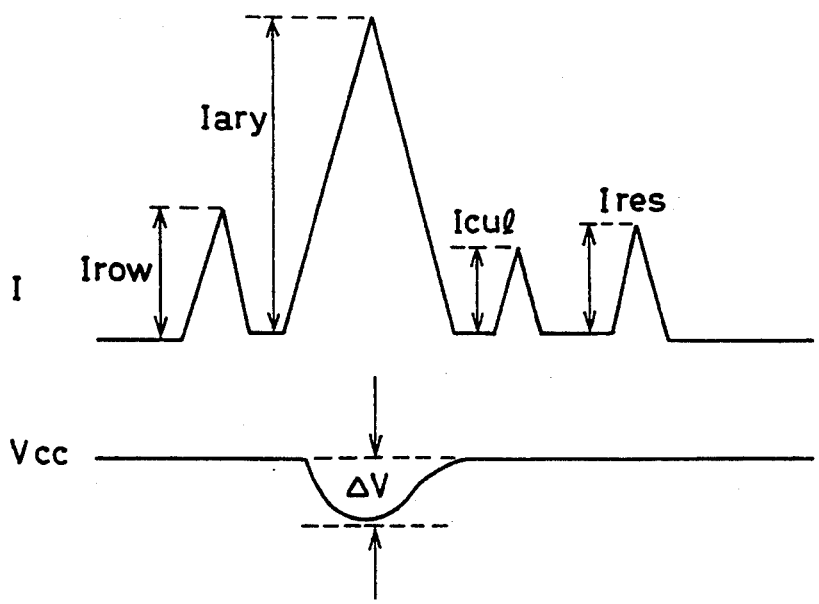
FIG. 25 is a waveform diagram showing change of a consumption current level of a conventional DRAM.

A decrease in power consumed in one read operation implies a decrease in maximum consumption current Iary shown in FIG. 25. Power supply voltage Vcc is prevented from falling by a decrease in maximum consumption current Iary, so that the occurrence of malfunction in a DRAM is prevented.

As described above, four-state address signals MA0 through MA11 are generated from the memory access circuit shown in FIG. 1 and then supplied to DRAM 10. DRAM 10, as shown in FIG. 8, comprises two-state address signal generator 15, by which four-state address signals MA0 through MA11 are converted to row address signals RA0 through RA11 and column address signals CA0 through CA11 each having two states. As it is not necessary to adopt an address multiplexing system in DRAM 10, row address signals RA0 through RA11 and the column address signals CA0 through CA11 can be applied to row decoder 12 and column decoder 13 stably, that is, accurately under the requirement of high speed operation. As a result, accurate addressing is performed in high speed operation. In addition, two-state address signal generator 15 shown in FIG. 8 generates internal address signals IA0 through IA23 of 24 bits which can be used either as row address signals or as column address signals, so that the use can be controlled by address distributing circuit 230 shown in FIG. 13. Accordingly, as shown in FIGS. 24(B) and (C) the number of sense amplifiers activated in one read operation can be reduced, and therefore it is possible to reduce the total power consumption shown in FIG. 26.

Although the above description was made with reference to a case where the invention is applied to a DRAM, it should be pointed out that the invention is also applicable to other semiconductor memories such as a SRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a memory cell array including a plurality of memory cells arranged in rows and columns;
    means for receiving a four-state address signal having four states to designate a row and a column of said memory cell array;
    two-state address generating means responsive to the four-state address signal for generating a two-state row address signal and a two-state column address signal each having two states; and
    selecting means responsive to the two-state row address signal and the two-state column address signal for selecting the row and the column of said memory cell array.

2. The semiconductor memory device according to claim 1, wherein said two-state address generating means comprises:
    reference potential generating means for generating first, second and third reference potentials each having a different level;
    first, second and third comparator means for receiving the first, second and third reference potentials, respectively, and comparing a potential of the four-state address signal with a corresponding reference potential; and
    signal potential determining means connected between a power supply potential and a ground potential and responsive to output signals provided from said first, second and third comparator means for determining potentials of said two-state row address signal and two-state column address signal.

3. The semiconductor memory device according to claim 1, wherein said selecting means comprises:
    row decoder means for receiving the two-state row address signal and decoding the two-state row address signal to select a word line within said memory cell array; and
    column decoder means for receiving the two-state column address signal and decoding the two-state column address signal to select a bit line within said memory cell array.

4. The semiconductor memory device according to claim 1, wherein said semiconductor memory device comprises a dynamic random access memory (DRAM).

5. A memory access system comprising a semiconductor memory device including a memory cell array which comprises a plurality of memory cells arranged in rows and columns, comprising:
    two-state address generating means for generating a two-state row address signal and a two-state column address signal each having two states to designate a row and a column of said memory cell array, respectively; and
    address converting means responsive to the two-state row address signal and the two-state column address signal for generating a four-state address signal having four states to designate a row and a column of said memory cell array;
    said semiconductor memory device comprising
        address reverse converting means for reversely converting the four-state address signal to said two-state row address signal and said two-state column address signal, and
        selecting means responsive to the converted two-state row address signal and the two-state column address signal for selecting the row and the column of said memory cell array.

6. The memory access system according to claim 5, wherein said address converting means comprises:
    reference potential generating means for generating first through fourth reference potentials to define said four states;
    two-bit decoder means for receiving said two-state row address signal and two-state column address signal and decoding said two-state row address signal and two-state column address signal to generate a potential selection signal for selecting said first through fourth reference potentials; and
    potential selecting means connected to said reference potential generating means and responsive to the potential selection signal applied from said two-bit decoder means for selectively providing one of said first through fourth reference potentials as said four-state address signal.

7. The memory access system according to claim 6, wherein said address converting means further comprises noise reducing means connected between said reference potential generating means and potential selecting means for reducing noise which might be included in the four-state address signal output from said potential selecting means.

8. The memory access system according to claim 5, wherein said two-state address generating means comprises:
    a microprocessing unit generating a virtual address signal for accessing to said semiconductor memory device; and
    real address converter means for receiving said virtual address signal and converting said virtual address signal to said two-state row address signal and two-state column address signal.

9. The memory access system according to claim 5, wherein said selecting means comprises:
    row decoder means for receiving the two-state row address signal and decoding the two-state row address signal to select a word line within said memory cell array; and
    column decoder means for receiving the two-state column address signal and decoding the two-state column address signal to select a bit line within said memory cell array.

10. A semiconductor memory device, comprising:

a memory cell array including a first plurality of memory cells arranged in a second plurality of rows and a third plurality of columns, said second plurality being larger than said third plurality according to an exponential function of 2;

the third plurality of sense amplifiers provided in a row direction of said memory cell array and amplifying a data signal read from said memory cell;

means for receiving a four-state address signal having four states to designate a row and a column of said memory cell array;

two-state address generating means responsive to the four-state address signal for generating two-state address signals each having two states;

address distributing means for distributing the two-state address signals generated from said two-state address generating means to a two-state row address signal for selecting a row of said memory cell array and a two-state column address signal for selecting a column of said memory cell array; and selecting means responsive to the two-state row address signal and the two-state column address signal for selecting a row and a column of said memory cell array.

11. The semiconductor memory device according to claim 10, further comprising means for generating a distribution control signal for controlling distribution of the two-state address signals generated from said two-state address generating means according to a program previously stored; wherein said address distributing means distributing the two-state address signals to said two-state row address signal and the two-state column address signal in response to the distribution control signal.

12. A semiconductor memory device, comprising:

a memory cell array including a plurality of memory cells arranged in rows and columns;

means for receiving a four-state address signal having four states to designate a row or a column of said memory cell array;

two-state address generating means responsive to the four-state address signal for generating a two-state address signal having two states; and selecting means responsive to the two-states address signal for selecting the row or the column of said memory cell array.

13. A memory access system comprising a semiconductor memory device including a memory cell array which comprises a plurality of memory cells arranged in rows and columns, comprising:

two-state address generating means for generating a two-state address signal having two states to designate a row or a column of said memory cell array, respectively; and address converting means responsive to the two-state address signal for generating a four-state address signal having four states to designate the row and the column of said memory cell array;

said semiconductor memory device further including;

address reverse converting means for reversely converting the four-state address signal to said two-state address signal; and selecting means responsive to the converted address signal for selecting the row and the column of said memory cell array.

14. A memory access system comprising a semiconductor memory device including an internal circuit to be controled, comprising:

two-state control signal generating means for generating a two-state control signal having two states to control said internal circuit; and converting means responsive to the two-state control signal for generating a n-state (n>2) control signal having n states to control said internal circuit;

said semiconductor memory device further including;

reverse converting means for converting the n-state control signal to said two-state control signal; and control means responsive to the converted said two-rate control signal for controling said internal circuit.

15. A semiconductor memory device, comprising:

a memory cell array including a plurality of memory cells arranged in rows and columns;

external address signal inputting means for receiving an external address signal of n bits, said external address signal inputting means including n address signal inputting terminals each receiving an address signal of 1 bit out of said external address signal of n bits, wherein an external address signal of each bit of said external address signal of n bits designates a row address and a column address;

internal address signal generation means responsive to an external address signal of n bits entered via said external address signal inputting means for providing an internal address signal of 2n bits, wherein an internal address signal of each bit of said internal address signal of 2n bits indicates one address signal of a row address signal of 1 bit and a column address signal of 1 bit; and selecting means responsive to an internal address signal of 2n bits from said internal address signal generation means for selecting a row and a column of said memory cell array.

16. The semiconductor memory device according to claim 15, wherein said selecting means comprises:

a row decoder for selecting a word line within said memory cell array; and a column decoder for selecting a bit line within said memory cell array.

17. The semiconductor memory device according to claim 15, wherein said semiconductor memory device comprises a dynamic random access memory (DRAM).

18. A semiconductor memory device, comprising:

a memory cell array including a plurality of memory cells arranged in a plurality of rows and columns, said plurality of rows being greater in number than said plurality of columns;

address distributing means responsive to an internal address signal of (s+t) bits for distributing the internal address signal into a row address signal of s bits and a column address signal of t bits for providing the same, wherein s and t are integers, and s is greater than t;

row selecting means responsive to a row address signal of s bits from said address distributing means for selecting a row in said memory cell array; and column selecting means responsive to a row address signal of t bits from said address distributing means for selecting a column in said memory cell array.

19. The semiconductor memory device according to claim 18, further comprising means for generating a distribution control signal for controlling distribution of the row address signal of s bits and column address signal of t bits according to a program previously stored; wherein said address distributing means distributing the internal address signal into a the row address signal of s bits and the column address signal of t bits in response to the distribution control signal.

20. The semiconductor memory device according to claim 18, wherein said row selecting means comprises a row decoder for selecting a word line within said memory cell array; and said column selecting means comprises a column decoder for selecting a bit line within said memory cell array.

21. The semiconductor memory device according to claim 18, wherein said semiconductor memory device comprises a dynamic random access memory (DRAM).

* * * * *